(12) United States Patent
Mizuta et al.

(10) Patent No.: US 10,490,677 B2
(45) Date of Patent: *Nov. 26, 2019

(54) SOLID STATE IMAGING APPARATUS, PRODUCTION METHOD THEREOF AND ELECTRONIC DEVICE

(71) Applicant: Sony Corporation, Tokyo (JP)

(72) Inventors: Kyohei Mizuta, Kumamoto (JP); Tomokazu Ohchi, Kumamoto (JP); Yohei Chiba, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/017,541

(22) Filed: Jun. 25, 2018

(65) Prior Publication Data

US 2018/0301573 A1 Oct. 18, 2018

Related U.S. Application Data

(60) Continuation of application No. 15/830,935, filed on Dec. 4, 2017, now Pat. No. 10,014,417, which is a
(Continued)

(30) Foreign Application Priority Data

Jul. 5, 2013 (JP) .................................. 2013-141762
Mar. 19, 2014 (JP) .................................. 2014-056608

(51) Int. Cl.
*H01L 31/0224* (2006.01)
*H01L 27/146* (2006.01)
(Continued)

(52) U.S. Cl.
CPC .. *H01L 31/022416* (2013.01); *H01L 27/1462* (2013.01); *H01L 27/1463* (2013.01); *H01L 27/1464* (2013.01); *H01L 27/1469* (2013.01); *H01L 27/14621* (2013.01); *H01L 27/14623* (2013.01); *H01L 27/14627* (2013.01); *H01L 27/14629* (2013.01); *H01L 27/14632* (2013.01); *H01L 27/14634* (2013.01); *H01L 27/14636* (2013.01); *H01L 27/14645* (2013.01); *H01L 27/14685* (2013.01); *H01L 27/14687* (2013.01);
(Continued)

(58) Field of Classification Search
None
See application file for complete search history.

(56) References Cited

U.S. PATENT DOCUMENTS 8,492,805 B2 * 7/2013 Akiyama ................ H01L 31/18
257/291
8,946,797 B2 * 2/2015 Mizuta ................ H01L 27/1464
257/233
(Continued)

*Primary Examiner* — Telly D Green
(74) *Attorney, Agent, or Firm* — Sheridan Ross P.C.

(57) ABSTRACT

A solid state imaging apparatus includes an insulation structure formed of an insulation substance penetrating through at least a silicon layer at a light receiving surface side, the insulation structure having a forward tapered shape where a top diameter at an upper portion of the light receiving surface side of the silicon layer is greater than a bottom diameter at a bottom portion of the silicon layer. Also, there are provided a method of producing the solid state imaging apparatus and an electronic device including the solid state imaging apparatus.

14 Claims, 30 Drawing Sheets

Related U.S. Application Data division of application No. 15/337,216, filed on Oct. 28, 2016, now Pat. No. 9,871,148, which is a continuation of application No. 14/319,941, filed on Jun. 30, 2014, now Pat. No. 9,520,430.

(51) Int. Cl.
*H04N 5/357* (2011.01)
*H04N 5/3745* (2011.01)

(52) U.S. Cl.
CPC ....... *H04N 5/3575* (2013.01); *H04N 5/37455* (2013.01)

(56) References Cited

U.S. PATENT DOCUMENTS

| | | | |
|---|---|---|---|
| 9,048,354 B2* | 6/2015 | Park | H01L 31/022408 |
| 9,171,968 B2* | 10/2015 | Oka | H01L 31/02 |
| 9,177,981 B2* | 11/2015 | Nishizawa | H01L 27/14618 |
| 2011/0186917 A1* | 8/2011 | Akiyama | H01L 31/18 |
| | | | 257/292 |
| 2012/0217374 A1* | 8/2012 | Nishizawa | H01L 27/14618 |
| | | | 250/208.1 |
| 2013/0256824 A1* | 10/2013 | Mizuta | H01L 27/1464 |
| | | | 257/459 |
| 2013/0323875 A1* | 12/2013 | Park | H01L 31/022408 |
| | | | 438/70 |
| 2015/0263060 A1* | 9/2015 | Park | H01L 31/022408 |
| | | | 257/432 |

\* cited by examiner

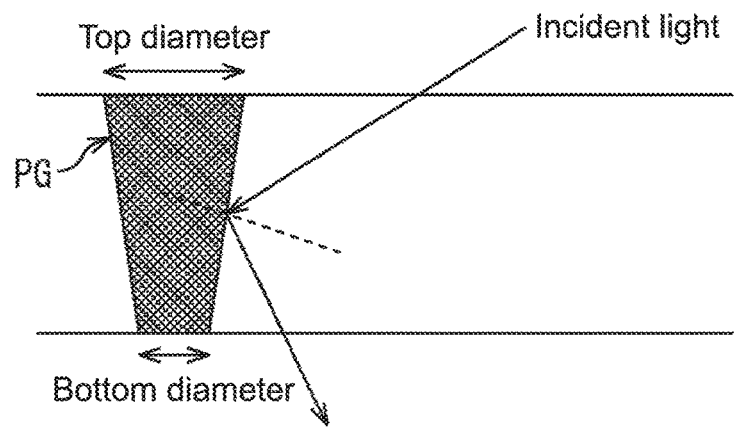
Forward taper (top diameter > bottom diameter)
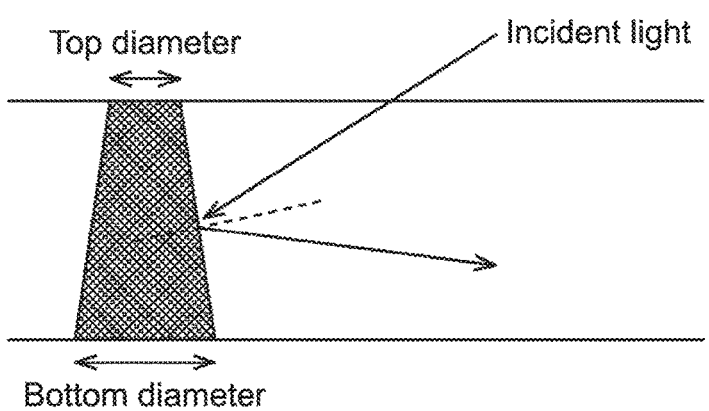
Inverse taper (top diameter < bottom diameter)

SOLID STATE IMAGING APPARATUS, PRODUCTION METHOD THEREOF AND ELECTRONIC DEVICE

CROSS REFERENCE TO RELATED APPLICATIONS

This application is a continuation of U.S. patent application Ser. No. 15/830,935, filed Dec. 4, 2017, which is a divisional of U.S. patent application Ser. No. 15/337,216, filed Oct. 28, 2016, now U.S. Pat. No. 9,871,148, which is a continuation of U.S. patent application Ser. No. 14/319, 941, filed Jun. 30, 2014, now U.S. Pat. No. 9,520,430, which claims the benefit of Japanese Priority Patent Application JP 2013-141762 filed Jul. 5, 2013 and Japanese Priority Patent Application JP 2014-056608 filed Mar. 19, 2014, the entire contents of which are incorporated herein by reference.

BACKGROUND

The present disclosure relates to a solid state imaging apparatus, a production method thereof and an electronic device, more particularly to a solid state imaging apparatus, a production method thereof and an electronic device being capable of reducing a flare component.

SUMMARY

A method of producing a semiconductor chip includes forming a plurality of semiconductor chips on a wafer, and dicing the semiconductor chips using a blade along scribe areas to separate the semiconductor chips. In the a method, chipping that may be generated by dicing should be prevented.

When electrode pads formed within the semiconductor chips are wire bonded or when the electrode pads are probed upon inspection, a leak or a damage should not be generated even if a side wall is contacted with a bonding wire or a probe.

In order to prevent chipping that may be generated by dicing using a blade or a leak or a damage generated upon wire bonding or probing, solid state imaging apparatuses having a variety of guard rings (prevention walls) have been proposed (for example, see Japanese Patent Application Laid-open Nos. 2012-17896, 2011-114261, 2012-231027, 2010-219425, 2010-212735, 2010-109137 and 2007-324629).

However, in the technology described in Japanese Patent Application Laid-open No. 2012-17896, a metal material is used as a burying material of a guard ring. Once a crack is generated by a bonding damage, metal is diffused. A decrease in reliability may be of concern. In the technologies described in Japanese Patent Application Laid-open Nos. 2011-114261, 2012-231027, 2010-219425, 2010-212735, 2010-109137 and 2007-324629, due to their production methods, a guard ring has an inverse tapered shape where a diameter is gradually increased as it is away from a light incident surface side. Therefore, an incident light is reflected by the guard ring, whereby a flare gets worse.

It is therefore desirable to reduce a flare component.

According to a first embodiment of the present disclosure, there is provided a solid state imaging apparatus, including an insulation structure formed of an insulation substance penetrating through at least a silicon layer at a light receiving surface side, the insulation structure having a forward tapered shape where a top diameter at an upper portion of the light receiving surface side of the silicon layer is greater than a bottom diameter at a bottom portion of the silicon layer.

According to a second embodiment of the present disclosure, there is provided a method of producing a solid state imaging apparatus, including bonding a first substrate to a second substrate including a silicon layer on which a photo diode is formed; and trenching the second substrate from a light receiving surface side at least to a depth of the silicon layer in a longitudinal direction to form an opening where an insulation substance is filled.

According to a third embodiment of the present disclosure, there is provided an electronic device, including a solid state imaging apparatus having an insulation structure formed of an insulation substance penetrating through at least a silicon layer at a light receiving surface side, the insulation structure having a forward tapered shape where a top diameter at an upper portion of the light receiving surface side of the silicon layer is greater than a bottom diameter at a bottom portion of the silicon layer.

According to the first and the third embodiments of the present disclosure, there is provided an insulation structure formed of an insulation substance penetrating through at least a silicon layer at a light receiving surface side, and the insulation structure has a forward tapered shape where a top diameter at an upper portion of the light receiving surface side of the silicon layer is greater than a bottom diameter at a bottom portion of the silicon layer.

According to the second embodiment, the first substrate is bonded to the second substrate including a silicon layer on which a photo diode is formed; and then the second substrate is trenched from a light receiving surface side at least to a depth of the silicon layer in a longitudinal direction to form an opening where an insulation substance is filled.

The solid state imaging apparatus and the electronic device may be stand alone or a module incorporated into other apparatus.

According to the first to third embodiments of the present disclosure, a flare component can be reduced.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 9A and 9B each illustrates an effect of a pad surrounding guard ring;

DETAILED DESCRIPTION OF EMBODIMENTS

Hereinafter, an embodiment of the present disclosure will be described with reference to the drawings.

The embodiments of the present technology will be described in the following order.
1. Overall Structure of Solid State Imaging Apparatus
2. First Embodiment (Configuration Embodiment of Laminated and Back Illumination Type Solid State Imaging Apparatus)
3. Second Embodiment (Configuration Embodiment of Non-laminated and Back Illumination Type Solid State Imaging Apparatus)
4. Third Embodiment (Guard Ring Structure having Bowing Profile)
5. Fourth Embodiment (Trench Structure between Pixels having Bowing Profile)
6. Application to Electronic Device

1. Overall Structure of Solid State Imaging Apparatus

<Schematic Configuration of Solid State Imaging Apparatus>

Figure 1:
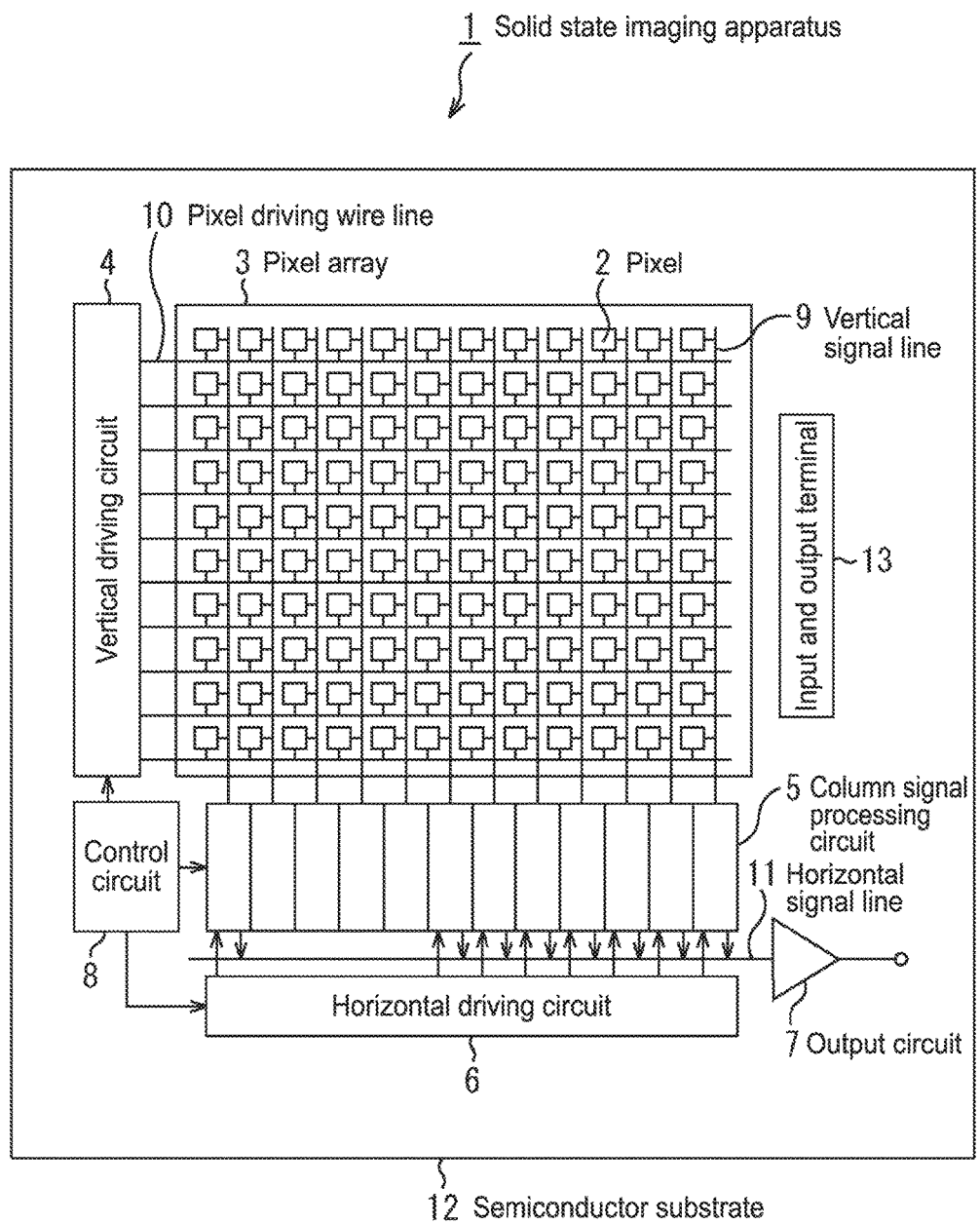
FIG. 1 shows a schematic configuration of a solid state imaging apparatus according to an embodiment of the present disclosure.

FIG. 1 shows a schematic configuration of a solid state imaging apparatus according to an embodiment of the present disclosure.

A solid state imaging apparatus 1 shown in FIG. 1 includes a semiconductor substrate 12 using silicon (Si) as a semiconductor, a pixel array 3 where pixels 2 are arranged in a two-dimensional array, and peripheral circuits. The peripheral circuits include a vertical driving circuit 4, a column signal processing circuit 5, a horizontal driving circuit 6, an output circuit 7 and a control circuit 8.

Each pixel 2 includes a photo diode as a photoelectric conversion element, and a plurality of pixel transistors. A plurality of pixel transistors include four MOS transistors, namely, a transfer transistor, a selection transistor, a reset transistor and an amplifier transistor.

Each pixel 2 may have a shared pixel structure. The shared pixel structure is composed of a plurality of photo diodes, a plurality of transfer transistors, a shared floating diffusion region and a shared other pixel transistor. In other words, in the shared pixel, the photo diode and the transfer transistor in a plurality of unit pixels share other pixel transistor.

The control circuit 8 receives data for instructing an operation mode and outputs data of inside information about the solid state imaging apparatus 1. In other words, the control circuit 8 generates a clock signal and a control signal that form an operation standard of the vertical signal circuit 4, the column signal processing circuit 5 and the horizontal driving circuit 6 based on a vertical synchronizing signal, a horizontal synchronizing signal and a master clock. The control circuit 8 outputs the clock signal and the control signal generated to the vertical driving circuit 4, the column signal processing circuit 5, the horizontal driving circuit 6 and others.

The vertical driving circuit 4 is composed, for example, of a shift resistor, selects a pixel driving wire lines 10, supplies the pixel driving wire lines 10 selected with a pulse for driving the pixel 2, and drives the pixel 2 per row unit. In other words, the vertical driving circuit 4 selectively scans each pixel 2 of the pixel array 3 per row unit in a vertical direction, and feeds, through the vertical signal lines 9, the column signal processing circuit 5 with a pixel signal based on a signal charge generated in accordance with a light receiving amount in the photoelectric conversion element in each pixel 2.

The column signal processing circuit 5 is arranged per column of the pixels 2, and carry out a signal processing such as a noise removal per pixel column from a signal outputted from the pixels 2 in one column. Specifically, the column signal processing circuit 5 carries out a signal processing such as a CDS (Correlated Double Sampling) for removing a fixed pattern noise inherent to the pixel, an AD conversion or the like.

The horizontal driving circuit 6 is composed, for example, of a shift resistor, sequentially outputs a horizontal scan pulse to sequentially select each column signal processing circuit 5, and outputs a pixel signal from each column signal processing circuit 5 to the horizontal signal line 11.

The output circuit 7 processes a signal sequentially fed from each column signal processing circuit 5 through a horizontal signal line 11, and outputs the signal. For example, the output circuit 7 may simply buffer, or may carry out a black level adjustment, a column deviation correction, a variety of digital signal processing or the like. An input and output terminal 13 exchanges a signal with the outside.

The solid state imaging apparatus 1 configured as described above is a CMOS image sensor called as a column AD method where the column signal processing circuit 5 is arranged per pixel column for carrying out a CDS processing and an AD conversion processing.

<Top Configuration View of Semiconductor Wafer>

Figure 2:
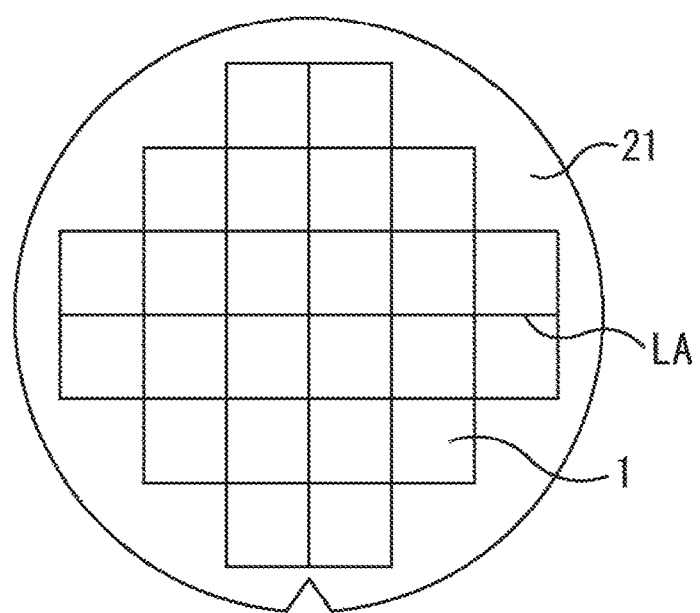
FIG. 2 shows a large-sized semiconductor wafer on which solid state imaging apparatuses are formed.

The solid state imaging apparatus 1 shown in FIG. 1 is provided by separating a plurality of solid state imaging apparatuses 1 arranged on a large-sized semiconductor wafer 21 shown in FIG. 2. Specifically, the large-sized semiconductor wafer 21 is diced using a blade (not shown) along scribe areas LA to separate the semiconductor wafer 21 into each solid state imaging apparatus 1 shown in FIG. 1, thereby forming the solid state imaging apparatus 1 shown in FIG. 1.

Figure 3:
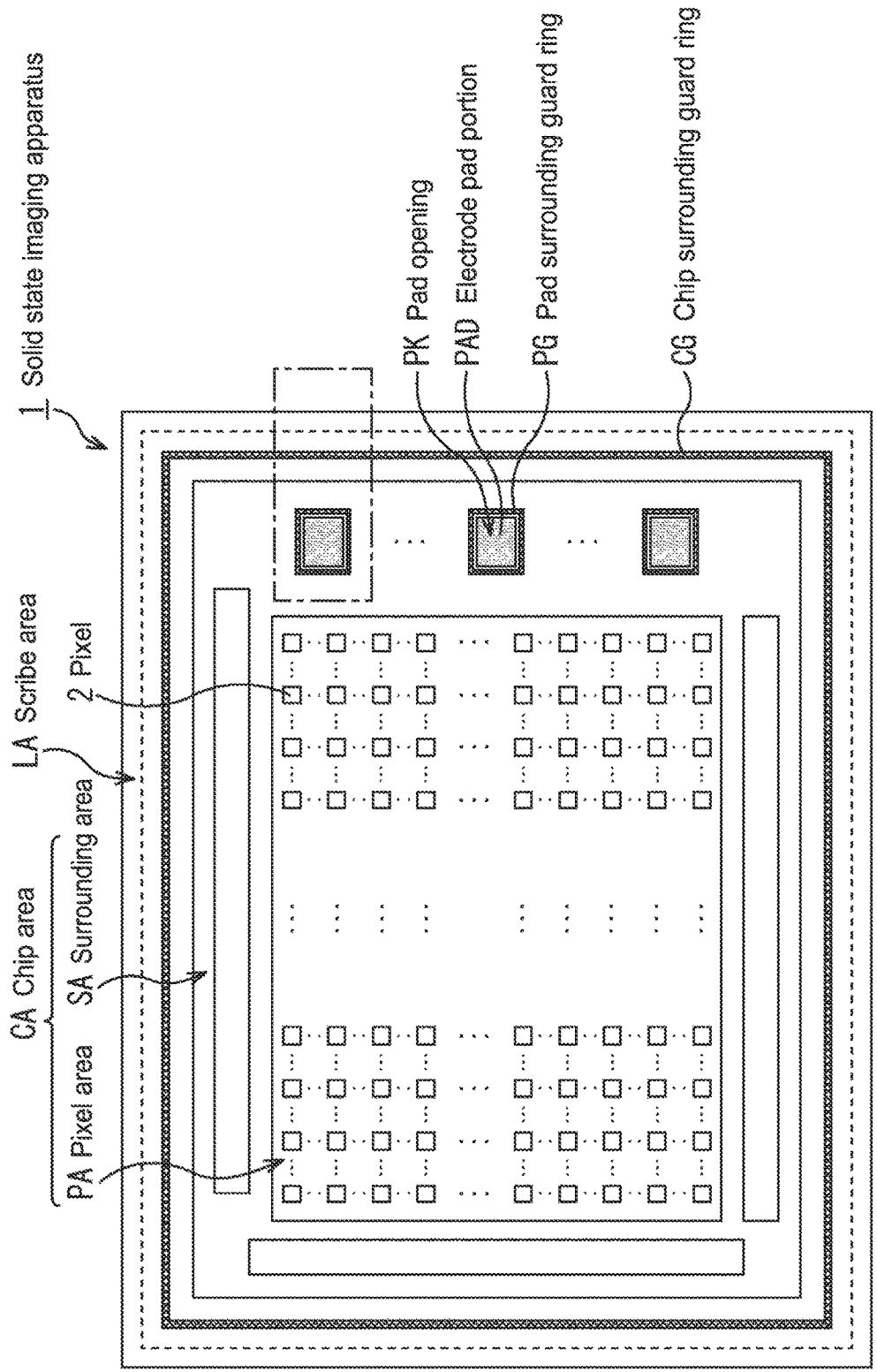
FIG. 3 shows a top configuration view of a solid state imaging apparatus.

FIG. 3 shows a top configuration view of the solid state imaging apparatus shown in FIG. 2.

Figure 4:
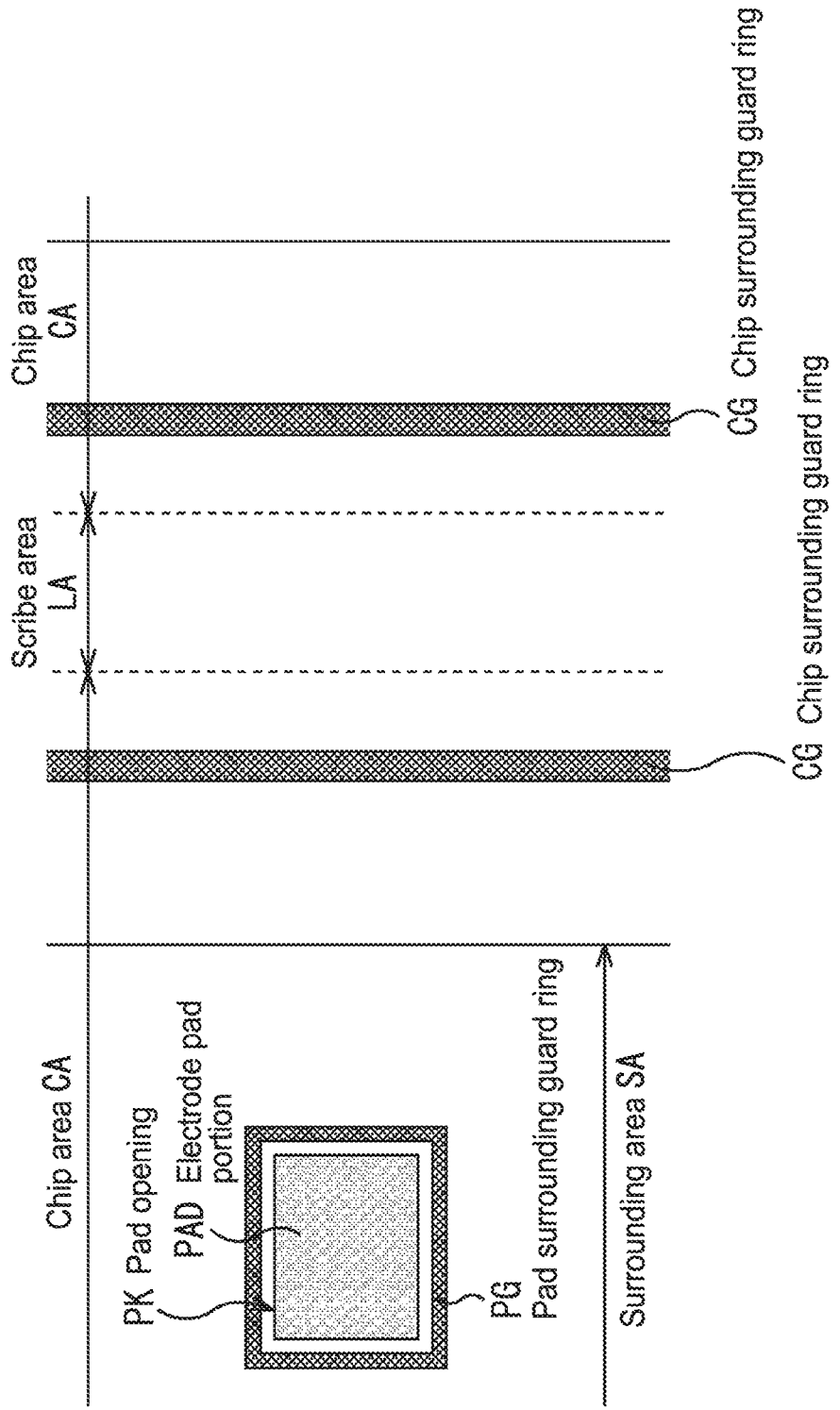
FIG. 4 is an enlarged view of a pad opening and a chip surrounding guard ring.

FIG. 4 is an enlarged view of a pad opening PK and a chip surrounding guard ring CG at a predetermined place shown by an alternate long and short dashed line in FIG. 3. Thus, FIG. 4 shows the chip surrounding guard ring CG of the solid state imaging apparatus 1 adjacent to the right side of the pad opening PK.

The solid state imaging apparatus 1 includes a chip area CA and a scribe area LA. The chip area CA includes a pixel area PA inside thereof and a surrounding area SA arranged outside thereof. In the pixel area PA, a plurality of pixels 2 are arranged in horizontal and vertical directions. The pixel area PA corresponds to the pixel array 3 shown in FIG. 1, and the surrounding area SA corresponds to the peripheral circuits where the vertical driving circuit 4, the column signal processing circuit 5, the horizontal driving circuit 6, the output circuit 7 and the control circuit 8 are arranged.

At the surrounding area SA, a plurality of the pad openings PK are disposed. At each pad opening PK, an electrode pad portion PAD is disposed, and a pad surrounding guard ring PG is disposed to surround the electrode pad portion PAD.

The scribe area LA is positioned to surround the chip area CA, and corresponds to a boundary between the solid state imaging apparatuses 1 adjacent. As described above, the scribe area LA is diced with a blade when the respective solid state imaging apparatuses 1 are separated.

Figure 5:
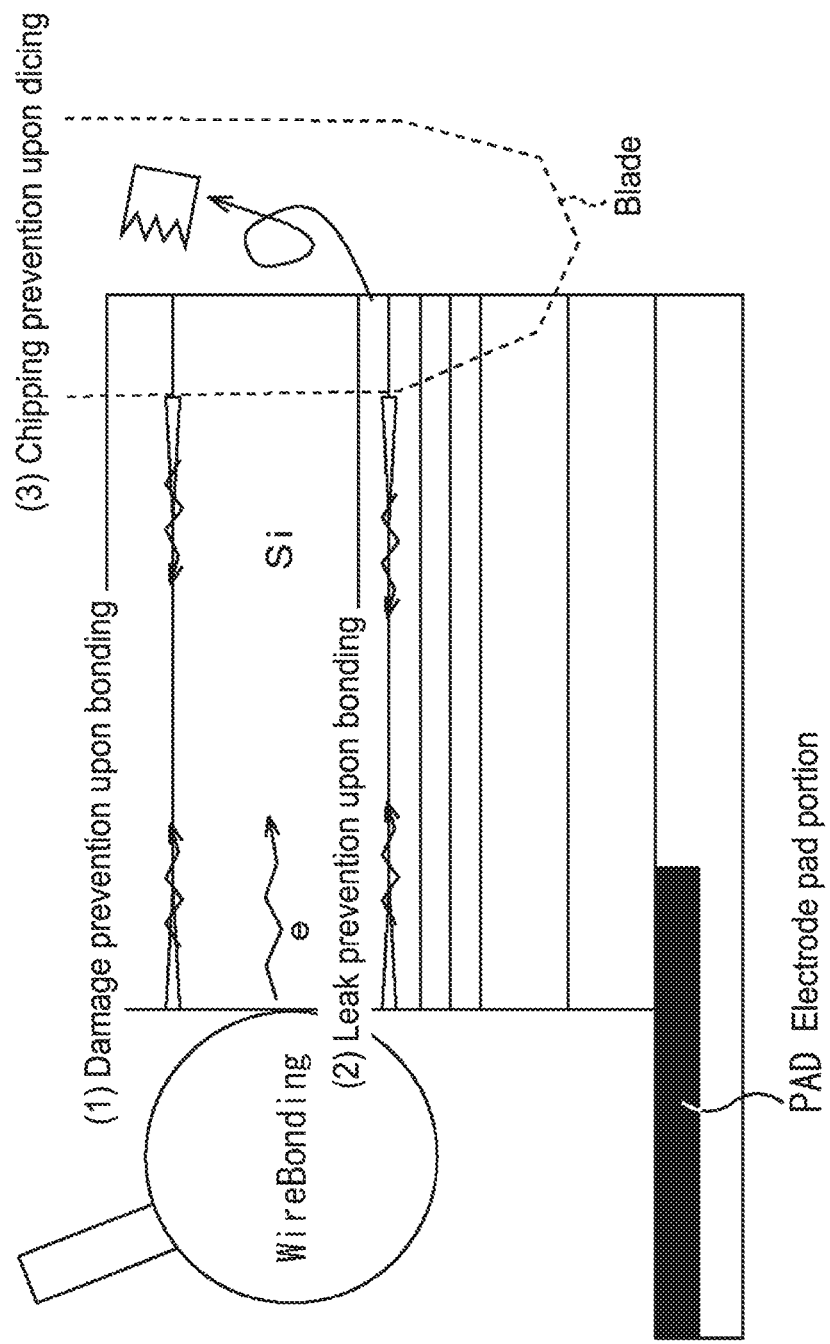
FIG. 5 illustrates functions of a pad surrounding guard ring and a chip surrounding guard ring.

FIG. 5 illustrates functions of a pad surrounding guard ring PG and a chip surrounding guard ring CG.

The pad surrounding guard ring PG is disposed in order to prevent a leak or a damage even if a side wall is accidentally contacted with a bonding wire or a probe for inspecting the electrode pad portion PAD, as shown in FIG. 5.

The chip surrounding guard ring CG is disposed in order to prevent chipping that may be generated by dicing the scribe area LA with a blade, as shown in FIG. 5.

As described above, the pad surrounding guard ring PG and the chip surrounding guard ring CG of the solid state imaging apparatus 1 prevent the leak, the damage and the chipping. In addition, the pad surrounding guard ring PG and the chip surrounding guard ring CG have structures to reduce a flare component. Hereinafter, the structure of the pad surrounding guard ring PG will be described in detail as an example.

2. First Embodiment

<Cross Sectional Configuration View>

Figure 6:
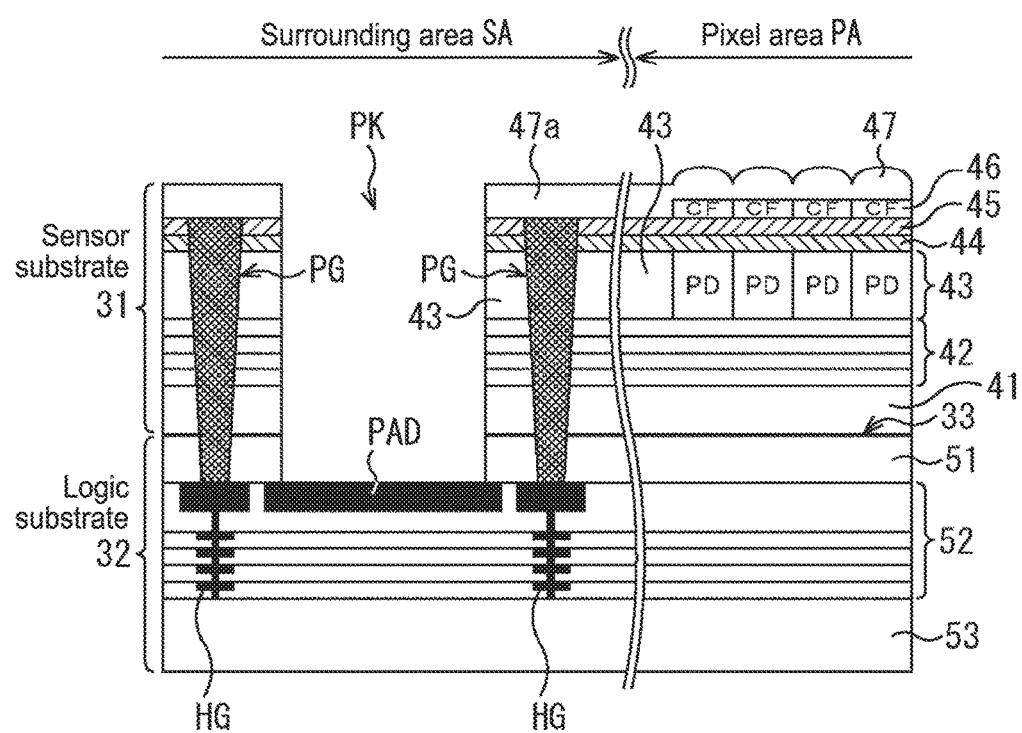
FIG. 6 is a cross sectional configuration view around a pad opening.

FIG. 6 is a cross sectional view showing a configuration around the pad opening PK of the solid state imaging apparatus at a predetermined place.

The semiconductor substrate 12 is formed by bonding a sensor substrate 31 as the first semiconductor substrate to a logic substrate 32 as the second semiconductor substrate, as shown in FIG. 6. In the sensor substrate 31, photo diodes of each pixel 2 etc. are formed. In the logic substrate 32, at least a part of logic circuits of the peripheral circuits is formed.

Thus, FIG. 6 shows a configuration embodiment of a laminated type solid state imaging apparatus 1 formed by bonding two semiconductor substrates. In FIG. 6, an upper side is a light receiving surface on which light is incident and is a rear surface of the semiconductor substrate 12. The solid state imaging apparatus 1 shown in FIG. 6 is a back illumination type solid state imaging apparatus.

The sensor substrate 31 is bonded to the logic substrate 32 with a plasma bonding or a bonding agent at a bonding interface 33. In the sensor substrate 31, an insulation layer 41, a multilayer wiring layer 42 and a silicon layer 43 are disposed from the bonding interface 33 in this order. The multilayer wiring layer 42 is composed of a plurality of wiring layers and interlayer insulation films interposed therebetween. In each pixel area PA of the silicon layer 43, the photo diode PD is formed per pixel unit.

On an upper surface of the silicon layer 43, an antireflection film 44 and an insulation film 45 are formed in this order.

As a material of the antireflection film 44, there can be used silicon nitride (SiN), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$) yttrium oxide ($Y_2O_3$) and the like.

As a material of the insulation film 45, there can be used a Si compound such as silicon oxide ($SiO_2$), silicon nitride (SiN), silicon oxynitride (SiON) and silicon carbide (SiC).

In the pixel area PA on an upper side of the insulation film 45, a color filter (CF) 46 of any of R (Red), G (Green) or B (Blue) is formed per pixel unit. The colors of the color filter (CF) 46 are arranged per pixel unit to provide the Bayer array, for example.

On an upper side of the color filter 46 in the pixel area PA, on-chip lenses 47 are formed per pixel unit. A material used for the on-chip lenses 47 includes a copolymerization based resin material such as a styrene based resin, an acryl based resin and a siloxane based resin.

On the other hand, in the surrounding area SA, as no color filter 46 are formed, a planarization film 47a made of the material used for the on-chip lenses 47 is formed.

Around the pad opening PK in the surrounding area SA (both sides in FIG. 6), the pad surrounding guard ring PG is penetrated and buried into a part of the logic substrate 32 using an insulation material (a non-metal material) in a longitudinal direction. Specifically, the insulation material filled as the pad surrounding guard ring PG can be any of the material used for the antireflection film 44, the Si compound used for the insulation film 45 and the copolymerization based resin material used for the on-chip lenses 47. Alternatively, a combination of the antireflection film material, the Si compound, the resin material with air gap (air, gas) as described later referring to FIGS. 10A to 10D may be used.

In the logic substrate 32 as the second semiconductor substrate, an insulation layer 51, a multilayer wiring layer 52 and a silicon layer 53 are disposed from the bonding interface 33 in this order.

The pad opening PK is open from the sensor substrate 31 to the insulation layer 51 of the logic substrate 32 in a longitudinal direction (a depth direction) in the surrounding area SA. On an uppermost layer (a layer nearest to the sensor substrate 31) of the multilayer wiring layer 52 that is a bottom surface of the pad opening PK, the electrode pad portion PAD is formed.

The pad surrounding guard ring PG disposed around the pad opening PK is formed from the insulation film 45 of the sensor substrate 31 to the insulation layer 51 of the logic substrate 32 in a longitudinal direction. Here, the pad surrounding guard ring PG has a forward tapered shape where a top diameter (a top width) at an upper light incident surface side is greater than a bottom diameter (a bottom width) at a bottom portion of an electrode pad portion PAD side in FIG. 6.

A wiring guard ring HG is disposed in the multilayer wiring layer 52 at a lower side of the pad surrounding guard ring PG.

The pad surrounding guard ring PG of the solid state imaging apparatus 1 having such a configuration can achieve the following effects.

The pad surrounding guard ring PG made of a non-metal material (an insulation material) is penetrated and buried from the insulation film 45 of the sensor substrate 31 into the insulation layer 51 of the logic substrate 32. If the pad surrounding guard ring PG is formed of a metal material, a side wall is damaged upon wire bonding to generate and propagate cracks. In contrast, according to the embodiment of the present disclosure, when the pad surrounding guard ring PG is formed with a non-metal material in a longitudinal direction (a vertical direction), boundaries where a damage propagates can be severed to inhibit propagation of cracks.

In the related art, when a bonding wire is contacted with the silicon layer 43 at the side wall, a current leak path may be formed upon driving. In contrast, according to the embodiment of the present disclosure, the pad surrounding guard ring PG made of a non-metal material in a longitudinal direction can be electrically insulated, thereby preventing the leak.

Although FIG. 6 shows the pad surrounding guard ring PG disposed around the pad opening PK, the chip surrounding guard ring CG disposed at a side of the scribe area LA is also formed similarly. In other words, the chip surrounding guard ring CG is formed with a non-metal material and is penetrated through the insulation film 45 of the sensor substrate 31 into the insulation layer 51 of the logic substrate 32 in a longitudinal direction.

By the configuration in the related art, a dicing load may generate cracks that propagate to partly chip the chip surrounding guard ring. The chipped part flies to an imaging area to cause a damage, which may affect imaging properties.

In contrast, according to the embodiment of the present disclosure, the chip surrounding guard ring CG having the above-described configuration can inhibit propagation of cracks and prevent chipping.

<Production Method>

Figure 7:
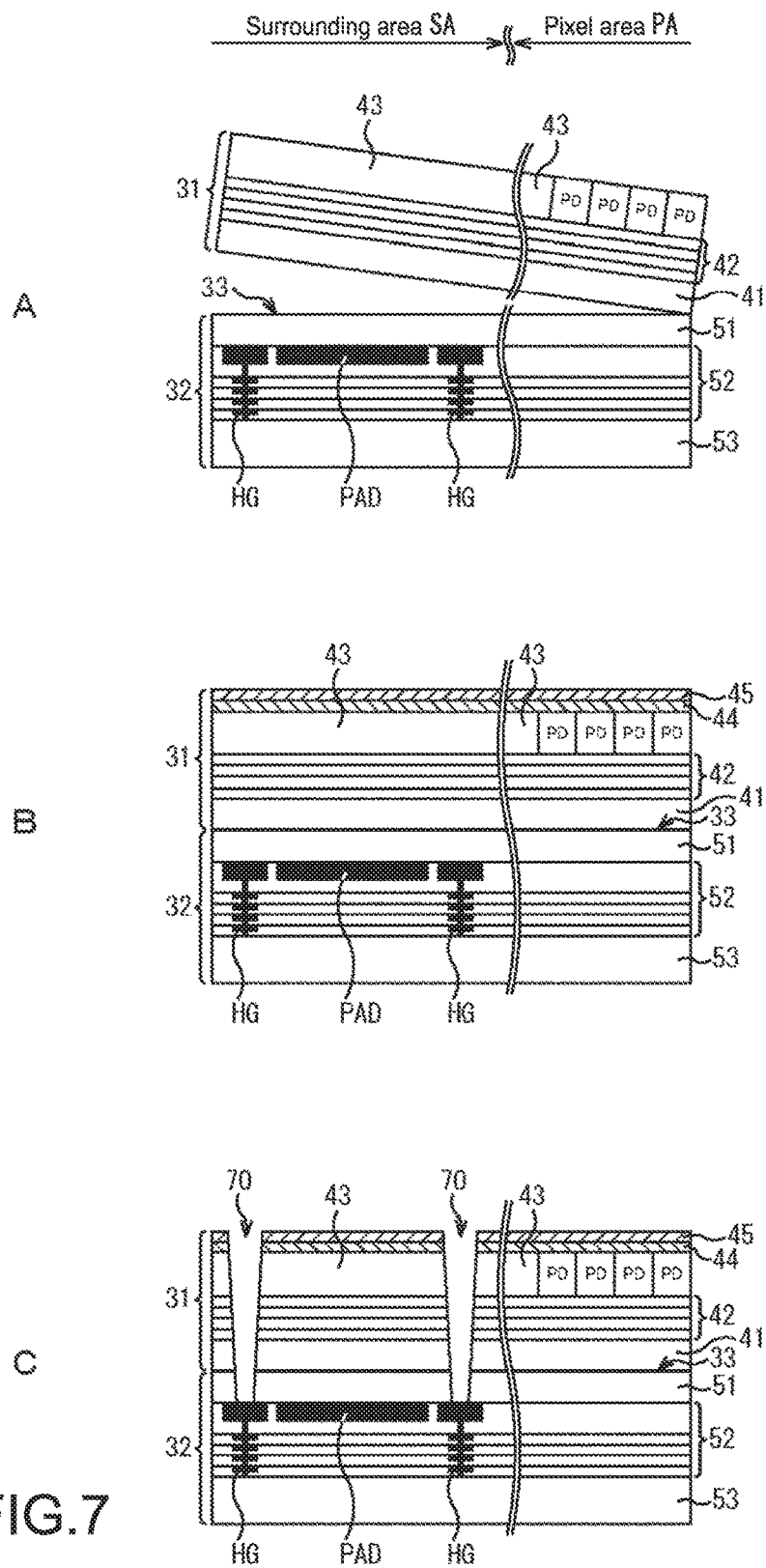
FIG. 7 is a view for illustrating a method of producing the solid state imaging apparatus shown in FIG. 6.
Figure 8:
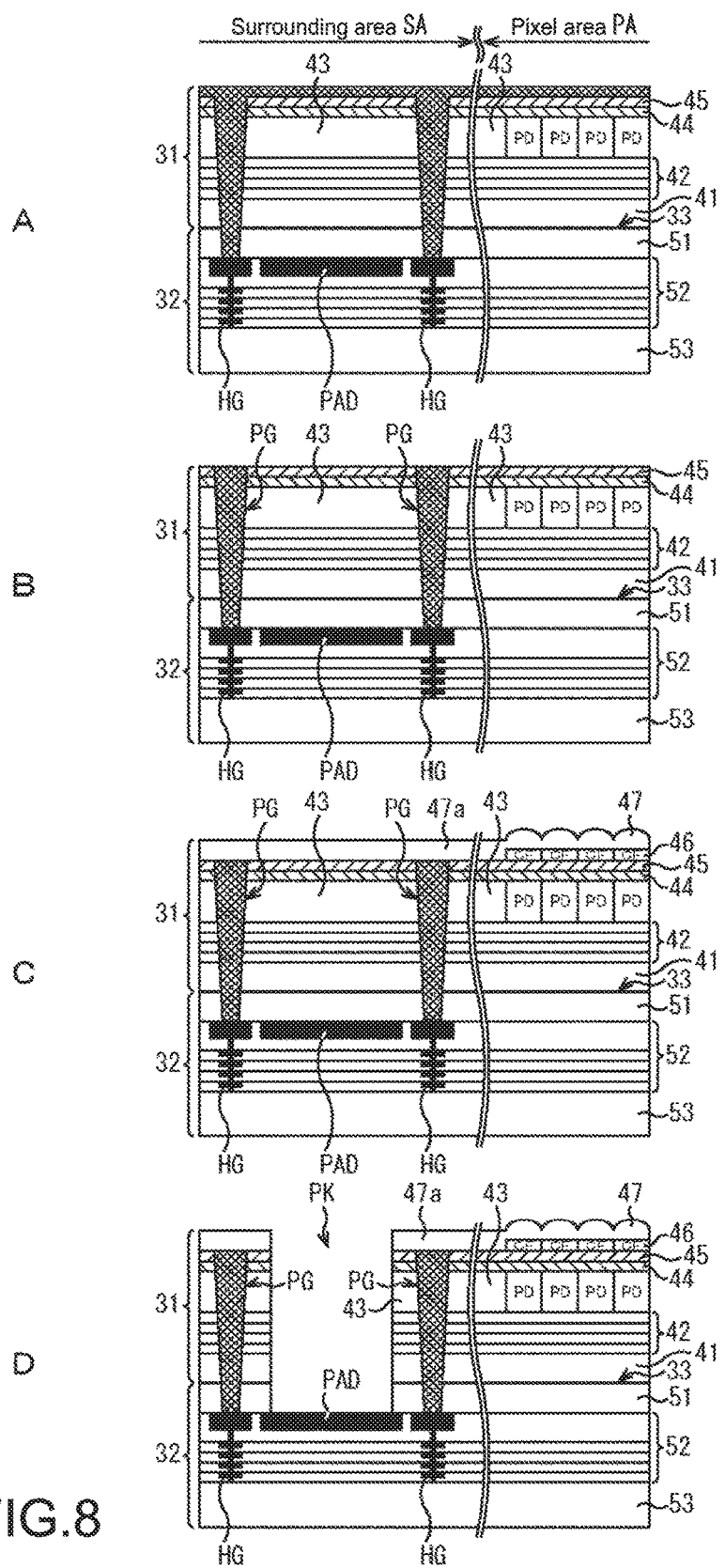
FIG. 8 is a view for illustrating a method of producing the solid state imaging apparatus shown in FIG. 6.

Next, referring to FIGS. 7 and 8, a method of producing the solid state imaging apparatus 1 in FIG. 6 will be described.

Firstly, as shown in FIG. 7A, the sensor substrate 31 and the logic substrate 32 separately produced are bonded with a plasma bonding or a bonding agent at the bonding interface 33.

After the sensor substrate 31 and the logic substrate 32 are bonded, as shown in FIG. 7B, the antireflection film 44 and the insulation film 45 are formed sequentially by a CVD method, for example.

Next, as shown in FIG. 7C, an area to be the pad surrounding guard ring PG is removed by a dry etching method, for example, to form an opening 70.

Then, as shown in FIG. 8A, the insulation material used for the antireflection film 44 is used to form a film over an entire upper surface of the sensor substrate 31 by the CVD method, for example, and the opening 70 to be the pad surrounding guard ring PG is filled with the insulation material.

An uppermost insulation material film is removed by a etch back or a CMP (Chemical Mechanical Polishing) treatment, as shown in FIG. 8B, such that the pad surrounding guard ring PG is formed. The insulation material buried may be the Si compound used for the insulation film 45, the resin material used for the on-chip lenses 47 or the like as well as the material used for the antireflection film 44.

Thereafter, as shown in FIG. 8C, the color filter 46 is formed in the pixel area PA, and the on-chip lenses 47 are then formed thereon.

For example, the color filter 46 can be formed by coating a coating liquid containing a coloring pigment and a photoresist resin by a coating method such as a spin coating method to form a coated film, and by patterning the coated film by a lithography technique.

For example, the on-chip lenses 47 can be formed by patterning a photosensitive resin material by the lithography technique and by deforming it to a lens shape by a reflow treatment. An upper side of the insulation film 45 in the surrounding area SA becomes the planarization film 47a made of the material used for the on-chip lenses 47.

Finally, as shown in FIG. 8D, the sensor substrate 31 and the insulation layer 51 of the logic substrate 32 above the electrode pad portion PAD are removed by a dry etching method, for example, to form the pad opening PK.

In this way, the solid state imaging apparatus 1 in FIG. 6 can be produced.

In the above-described embodiment, after the sensor substrate 31 and the logic substrate 32 are bonded to form the antireflection film 44 and the insulation film 45, the opening 70 to be the pad surrounding guard ring PG is formed. However, the opening 70 to be the pad surrounding guard ring PG may be formed at any time after the sensor substrate 31 and the logic substrate 32 are bonded. For example, after the sensor substrate 31 and the logic substrate 32 are bonded and before the antireflection film 44 and the insulation film 45 are formed, the opening 70 may be formed. In this case, after the opening 70 is formed, the antireflection film 44 and the insulation film 45 are sequentially formed. The opening 70 is filled with two types of materials of the antireflection film 44 and the insulation film 45, and the pad surrounding guard ring PG is formed. Alternatively, the opening 70 may be filled with three or more types of materials including the resin material used for the on-chip lenses 47.

The chip surrounding guard ring CG disposed at the side of the scribe area LA can be formed similar to the above-described pad surrounding guard ring PG.

As described above, the pad surrounding guard ring PG is formed from a back surface side (a light incident surface side) after the sensor substrate 31 and the logic substrate 32 are bonded. As shown in FIG. 9A, the pad surrounding guard ring PG has a forward tapered shape where a top diameter (a top width) is greater than a bottom diameter (a bottom width) at a bottom portion of an electrode pad portion PAD side.

When an inverse tapered shape where a top diameter is smaller than a bottom diameter as shown in FIG. 9B is compared to the forward tapered shape in the pad surrounding guard ring PG, light is inhibited from being incident on the photo diodes PD if the incident light is hit on the pad surrounding guard ring PG and is reflected. In this manner, using the pad surrounding guard ring PG and the chip surrounding guard ring CG according to the embodiment of the present disclosure, a flare component incident on the photo diodes PD can be reduced.

As described above, after the sensor substrate 31 and the logic substrate 32 are bonded, the pad surrounding guard ring PG is formed from a rear surface, thereby providing the forward tapered shape. Alternatively, it is possible to set a desirable taper angle (corresponds to a difference between a top diameter and a bottom diameter) by patterning etc.

As described above, after the sensor substrate 31 and the logic substrate 32 are bonded, the pad surrounding guard ring PG is formed from a rear surface. In this case, a margin for bonding misalignment is unnecessary. Therefore, a distance (a distance in a horizontal direction) between the electrode pad portion PAD and the pad surrounding guard ring PG can be shorten, thereby reducing a unit size (a chip size).

<Alternative Embodiment of Method of Filling Insulation Material as Pad Surrounding Guard Ring PG>

FIGS. 10A to 10D are views for illustrating an alternative method of filling an insulation material as a pad surrounding guard ring PG.

Figure 10A:
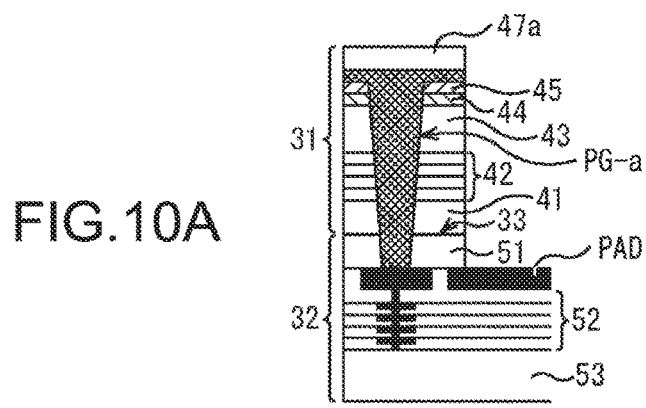
FIGS. 10A to 10D are views for illustrating an alternative method of filling a pad surrounding guard ring with an insulation material.

A pad surrounding guard ring PG-a shown in FIG. 10A is in a state that the insulation material film formed on the upper surface of the sensor substrate 31 shown in FIG. 8A remains without etch back and CMP treatment and is integrated with a buried portion. The pad surrounding guard ring PG-a may be any of the resin material used for the on-chip lenses 47 same as that used for an uppermost film 47a, the material used for the antireflection film 44, the Si compound used for the insulation film 45, as described above.

Figure 10B:
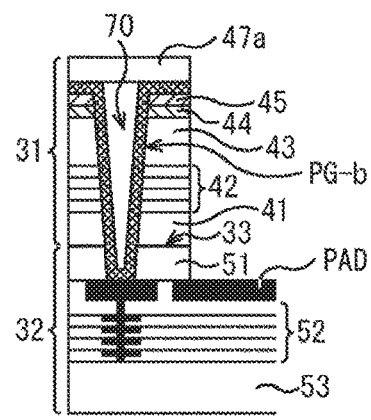

In a pad surrounding guard ring PG-b shown in FIG. 10B, the opening 70 of the pad surrounding guard ring PG is not entirely buried with the insulation material, only an interface (a surface) of the opening 70 is covered with the insulation material and a center of the opening 70 is filled with air.

Figure 10C:
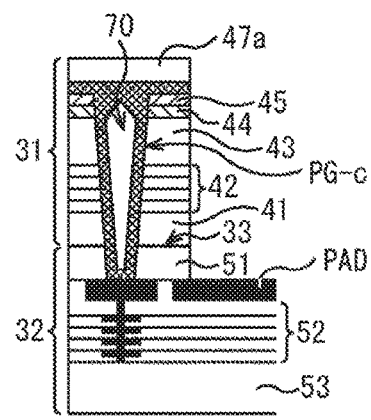

In a pad surrounding guard ring PG-c shown in FIG. 10C, the opening 70 of the pad surrounding guard ring PG is not entirely buried with the insulation material similar to that shown in FIG. 10B, but an upper surface of the opening 70 is blocked with the insulation material, and the inside of the opening 70 is filled with air.

The pad surrounding guard ring PG-b shown in FIG. 10B and the pad surrounding guard ring PG-c shown in FIG. 10C are filled with one type of the insulation material together with air. Alternatively, two or more types of insulation materials may be used together with air. When the pad surrounding guard ring PG is filled with two or more types of insulation materials together with air, the insulation materials are laminated in the following order: the insulation material used for the antireflection film 44, the Si compound used for the insulation film 45, the resin material used for the on-chip lenses 47 and the Si compound. Formation of one or more films among them can be skipped.

Figure 10D:
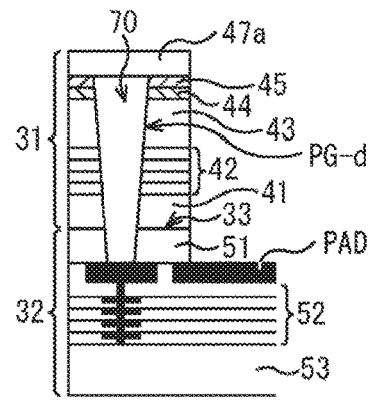

In a pad surrounding guard ring PG-d shown in FIG. 10D, the opening 70 is not filled with the insulation material and is an air gap (a hollow space). In other words, FIG. 10D shows the pat surrounding guard ring PD-d formed being filled with only air.

<Alternative Embodiment of Pad Surrounding Guard Rings PG Having Varying Depth>

FIGS. 11A to 11D illustrate alternative embodiments of the pad surrounding guard rings PG having varying depths.

According to the first embodiment shown in FIG. 6, the pad surrounding guard ring PG is formed from the insulation film 45 of the sensor substrate 31 to the insulation layer 51 of the logic substrate 32 in a depth direction. The depth (a length in a longitudinal direction) of the pad surrounding guard ring PG may be such that at least the silicon layer 43 of the sensor substrate 31 is trenched.

Figure 11A:
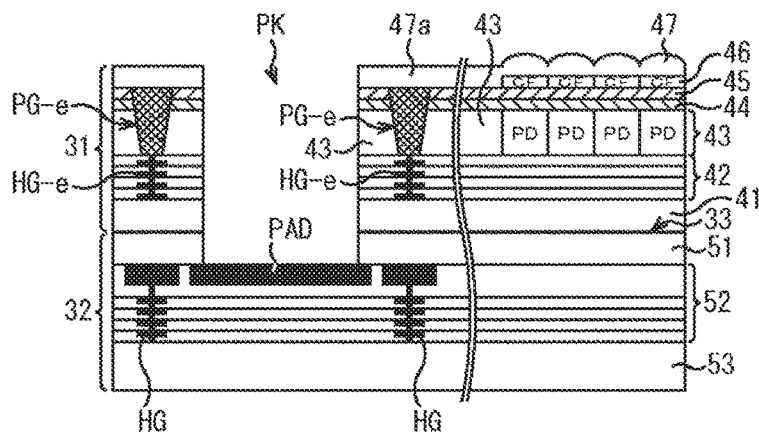
FIGS. 11A to 11D illustrate alternative embodiments of pad surrounding guard rings having varying depths.

FIG. 11A shows an embodiment that a pad surrounding guard ring PG-e is formed by forming an opening only in the silicon layer 43 of the sensor substrate 31 and burying the opening with the insulation material. Under the pad surrounding guard ring PG-e, a wiring guard ring HG-e is disposed.

Figure 11B:
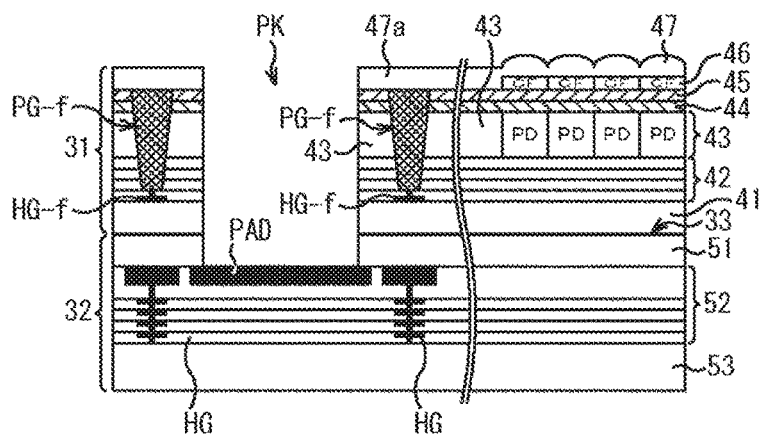

FIG. 11B shows an embodiment that a pad surrounding guard ring PG-f is formed by forming an opening in the silicon layer 43 and a part of the multilayer wiring layer 42 of the sensor substrate 31 and burying the opening with the insulation material, and a wiring guard ring HG-f is disposed in the rest of the multilayer wiring layer 42. The pad surrounding guard ring PG-f may be formed in any number of the multilayer wiring layer 42.

The configurations shown in FIGS. 11A and 11B each does not function as a stopper against the bonding interface 33 and are therefore weak against cracks on the bonding interface 33. However, the pad surrounding guard ring PG-e or PG-f is shallow, thereby minimizing PID (Plasma Induced Damage). In addition, there is a great freedom degree of wiring for drawing a power source from the electrode pad portion PAD.

Figure 11C:
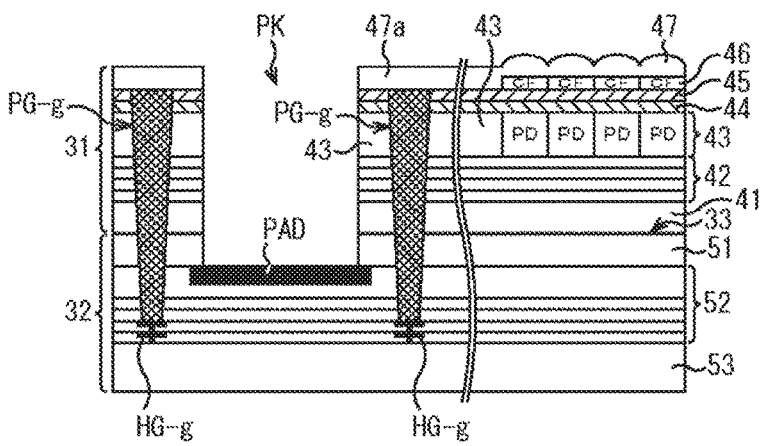

FIG. 11C shows an embodiment that a pad surrounding guard ring PG-g is formed by forming an opening in the sensor substrate 31 and a part of the multilayer wiring layer 52 of the logic substrate 32 and burying the opening with the insulation material, and a wiring guard ring HG-g is disposed in the rest of the multilayer wiring layer 52.

Figure 11D:
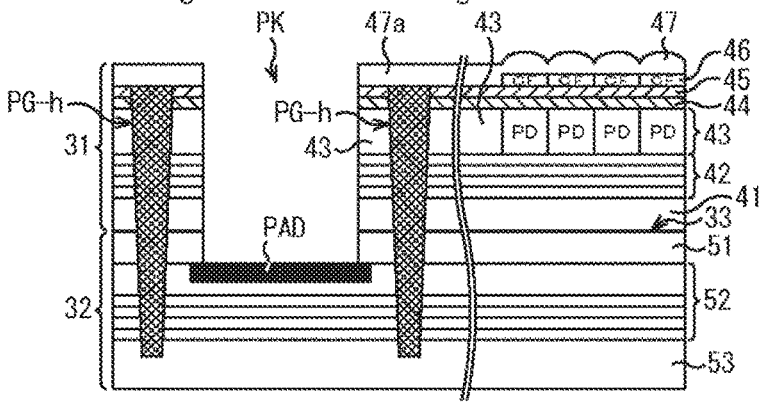

FIG. 11D shows an embodiment that a pad surrounding guard ring PG-h is formed by forming an opening in the sensor substrate 31 and a part of the silicon layer 53 of the logic substrate 32 and burying the opening with the insulation material.

The configurations shown in FIGS. 11C and 11D each functions as a stopper against the bonding interface 33 and therefore can inhibit propagation of cracks on the bonding interface 33. However, the PID may be increased. In addition, there is a limited freedom degree of wiring for drawing a power source from the electrode pad portion PAD.

<Embodiment of Wiring for Drawing Power Source>

Figure 12A:
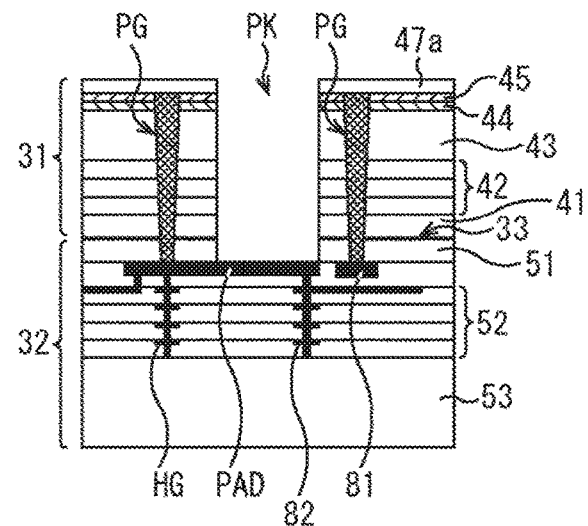
FIGS. 12A to 12C each shows an embodiment of a wiring for drawing a power source from an electrode pad portion.
Figure 12B:
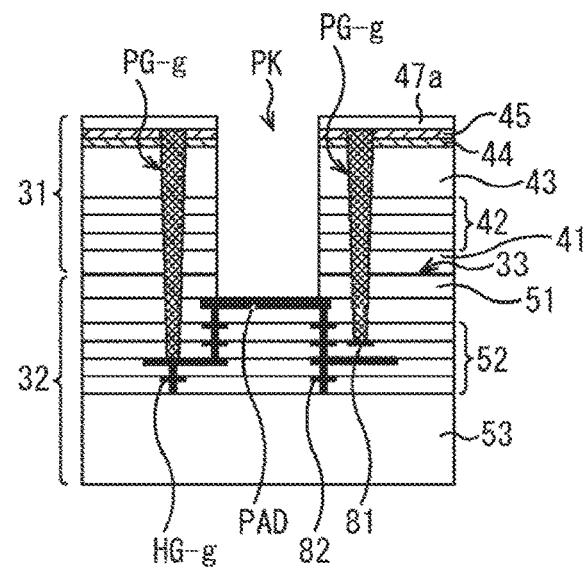
Figure 12C:
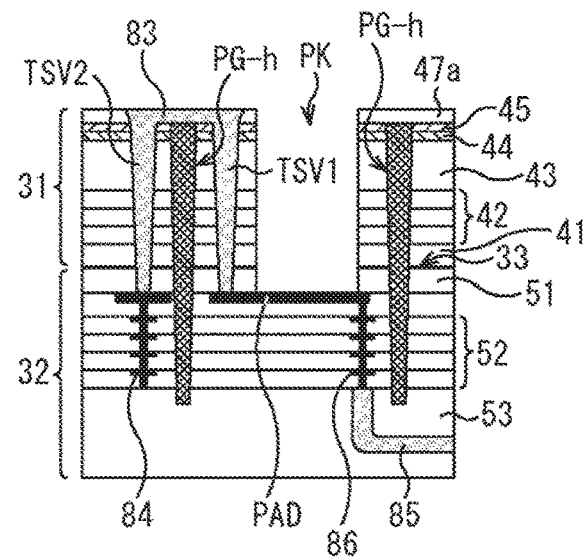

FIGS. 12A to 12C each shows an embodiment of a wiring for drawing a power source from the electrode pad portion PAD.

FIG. 12A shows an embodiment of a wiring for drawing a power source in the pad surrounding guard ring PG shown in FIG. 6, i.e., the embodiment of the wiring for drawing a power source in the pad surrounding guard ring PG filled with the insulation material to the insulation layer 51 of the logic substrate 32.

In FIG. 12A, there are shown embodiments for drawing two different power sources at left and right sides of the pad surrounding guard ring PG of the electrode pad portion PAD.

In the left side in FIG. 12A, the electrode pad portion PAD is extended and connected to the wiring guard ring HG, whereby the power source is drawn from the electrode pad portion PAD via the wiring guard ring HG.

On the other hand, in the right side in FIG. 12A, an isolated pad 81 is disposed under the pad surrounding guard ring PG and a wiring 82 for drawing a power source connected to the electrode pad portion PAD is separately disposed, thereby drawing the power source from the electrode pad portion PAD. In this case, as the isolated pad 81 is isolated from the electrode pad portion PAD and other wirings of the multilayer wiring layer 52, the PID can be prevented. The isolated pad 81 may be omitted.

FIG. 12B shows an embodiment of a wiring for drawing a power source in the pad surrounding guard ring PG-g shown in FIG. 11C, i.e., the embodiment of the wiring for drawing a power source in the pad surrounding guard ring PG-g filled with the insulation material to the multilayer wiring layer 52 of the logic substrate 32.

In FIG. 12B, there are shown embodiments for drawing two different power sources at left and right sides of the pad surrounding guard ring PG-g of the electrode pad portion PAD.

In the left side in FIG. 12B, the electrode pad portion PAD is connected to the wiring guard ring HG-g, whereby the power source is drawn from the electrode pad portion PAD via the wiring guard ring HG-g.

On the other hand, in the right side in FIG. 12B, an isolated pad 81 is disposed under the pad surrounding guard ring PG-g and a wiring 82 for drawing a power source connected to the electrode pad portion PAD is separately disposed, thereby drawing the power source from the electrode pad portion PAD. In this case, the PID can be prevented.

FIG. 12C shows an embodiment of a wiring for drawing a power source in the pad surrounding guard ring PG-h shown in FIG. 11D, i.e., the embodiment of the wiring for drawing a power source in the pad surrounding guard ring PG-h filled with the insulation material to a part of the silicon layer 53 of the logic substrate 32.

In FIG. 12C, there are shown embodiments for drawing two different power sources at left and right sides of the pad surrounding guard ring PG-h of the electrode pad portion PAD.

In the left side in FIG. 12C, through electrodes (TSV: Through-Silicon Via) are disposed and connected inside (at the electrode pad portion PAD side) and outside of the pad surrounding guard ring PG-h to draw the power source from the electrode pad portion PAD. In other words, a through electrode TSV1 disposed inside of the pad surrounding guard ring PG-h is connected to a through electrode TSV2 disposed outside thereof with a connection electrode 83, and the through electrode TSV2 is connected to a wiring layer 84, thereby drawing the power source from the electrode pad portion PAD.

On the other hand, in the right side in FIG. 12C, the silicon layer 53 of the logic substrate 32 is used to draw the power source. In other words, a semiconductor area 85 for drawing the power source is formed in the silicon layer 53 of the logic substrate 32 and is connected to a wiring for drawing a power source 86 connected to the electrode pad portion PAD, thereby drawing the power source from the electrode pad portion PAD.

<External Connection to Electrode Pad Portion Using TSV>

Figure 13:
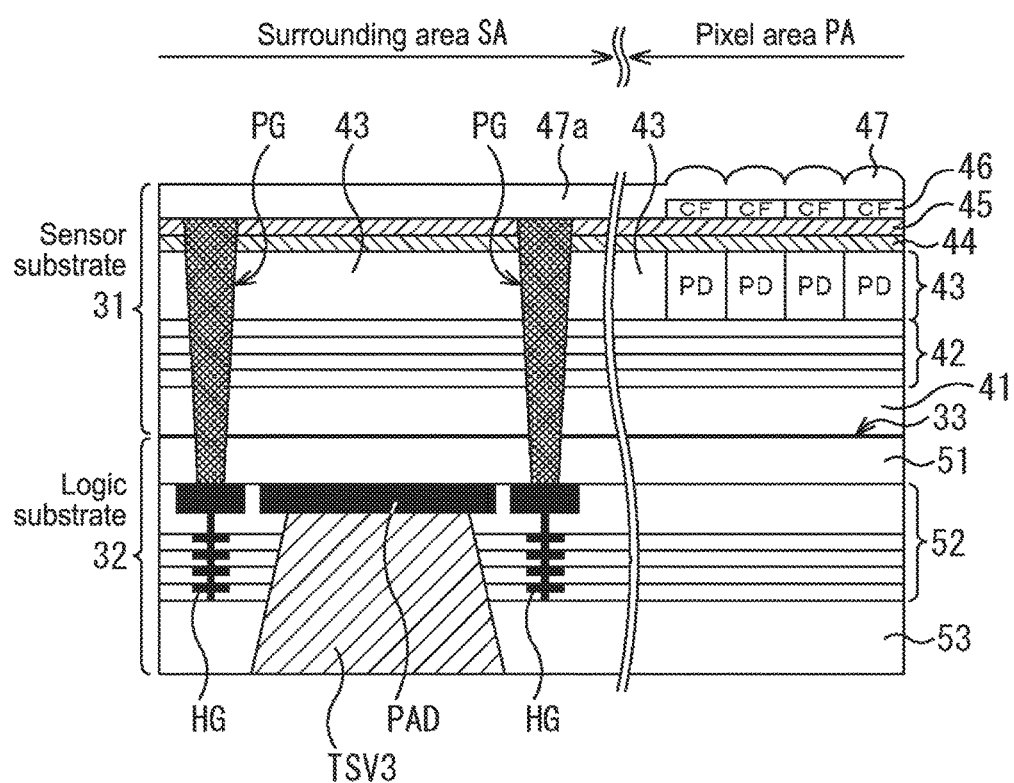
FIG. 13 illustrates a configuration embodiment of a solid state imaging apparatus that is externally connected using a through electrode.

FIG. 13 illustrates a configuration embodiment of the solid state imaging apparatus 1 that is externally connected to the electrode pad portion PAD using not wire bonding but a through electrode.

In other words, an upper portion of the electrode pad portion PAD is not opened. Instead of the pad opening PK, a through electrode TSV3 is disposed at a lower side of the electrode pad portion PAD. In this case, the wiring guard ring HG can inhibit propagation of cracks caused by thermal expansion of a metal material of the through electrode TSV3.

<Embodiment of Share Contact Structure>

Figure 14:
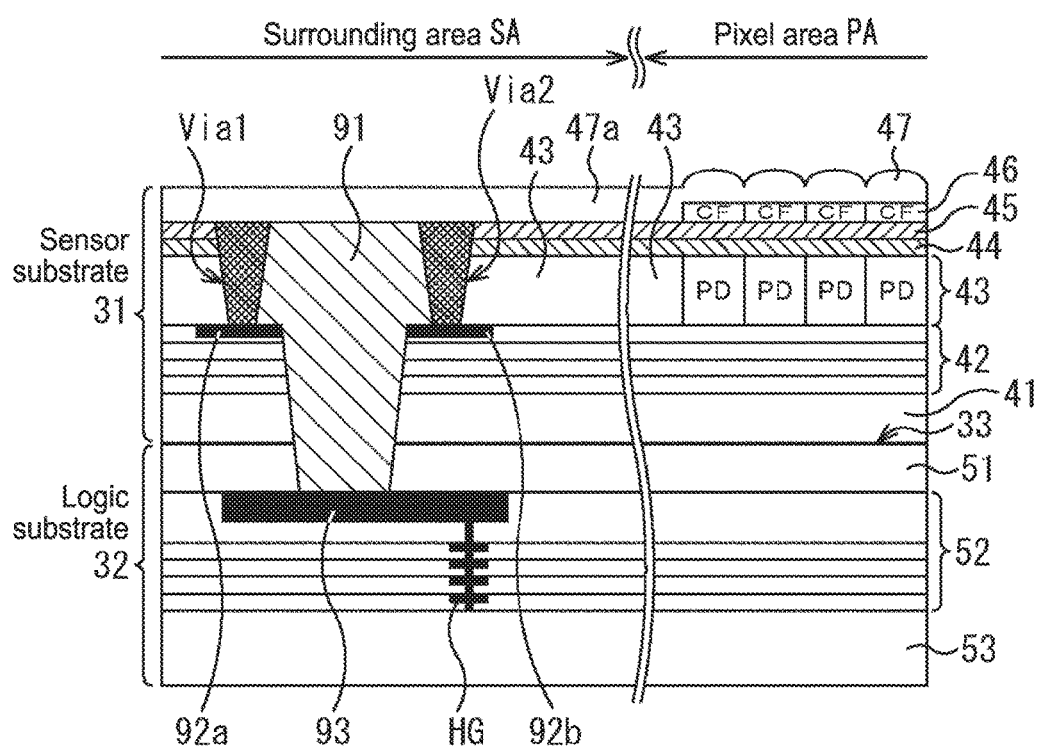
FIG. 14 shows an embodiment where a solid state imaging apparatus is utilized in a share contact structure.

FIG. 14 shows an embodiment where a through via is formed by the similar method of producing the pad surrounding guard ring PG and is utilized in a share contact structure.

In FIG. 14, the components corresponding to those in FIG. 6 are denoted by the same reference numerals, and thus detailed description thereof will be hereinafter omitted.

In FIG. 14, through vias Via1 and Via2 are formed by penetrating through the silicon layer 43 of the sensor substrate 31 by the similar method of producing the pad surrounding guard ring PG.

Between the through vias Via1 and the Via2, a connection conductor 91 is buried. The connection conductor 91 has the share contact structure and is connected to uppermost wiring layers 92a and 92b on the multilayer wiring layer 42 of the sensor substrate 31 and an uppermost wiring layer 93 of the logic substrate 32. The connection conductor 91 can be formed by a metal material such as tungsten (W), aluminum (Al), copper (Cu) and the like.

<Method of Producing Share Contact Structure>

FIGS. 15A to 15D are views for illustrating a method of producing the share contact structure shown in FIG. 14.

Figure 15A:
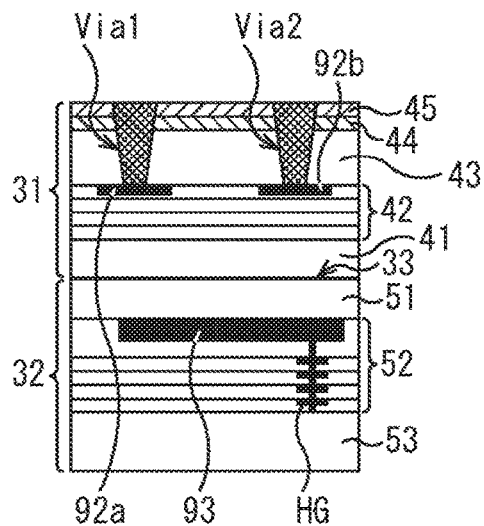
FIGS. 15A to 15D are views for illustrating a method of producing a share contact structure.

Firstly, as shown in FIG. 15A, the sensor substrate 31 and the logic substrate 32 separately produced are bonded at the bonding interface 33. Thereafter, the through vias Via1 and the Via2 are formed by the similar method of producing the pad surrounding guard ring PG. As the through vias Via1 and Via2 are formed after the sensor substrate 31 and the logic substrate 32 are bonded, the through vias Via1 and Via2 has a forward tapered shape.

Figure 15B:
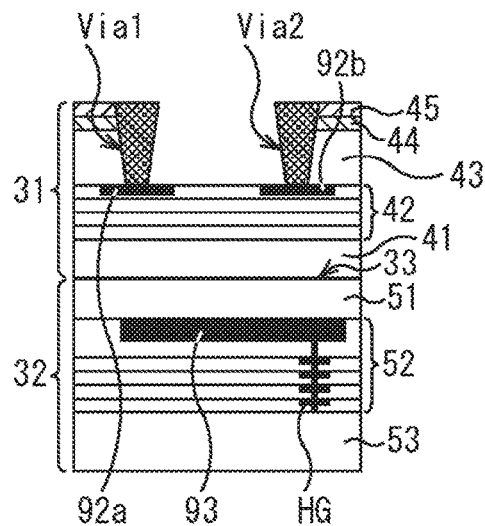

Next, as shown in FIG. 15B, the silicon layer 43, the antireflection film 44 and the insulation film 45 between the through vias Via1 and Via2 are removed by a dry etching method, for example. As the through vias Via1 and Via2 each functions as an etching stopper, the silicon layer 43 and the like can be easily removed.

Figure 15C:
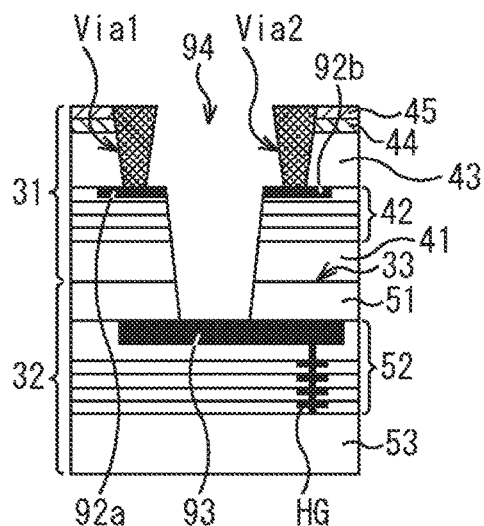

As shown in FIG. 15C, the insulation layer 41 and the multilayer wiring layer 42 disposed between the wiring layers 92a and 92b of the sensor substrate 31 and the insulation layer 51 of the logic substrate 32 are removed by a dry etching method, for example. In this way, an opening 94 with which a metal material for forming the connection conductor 91 is filled is formed.

Figure 15D:
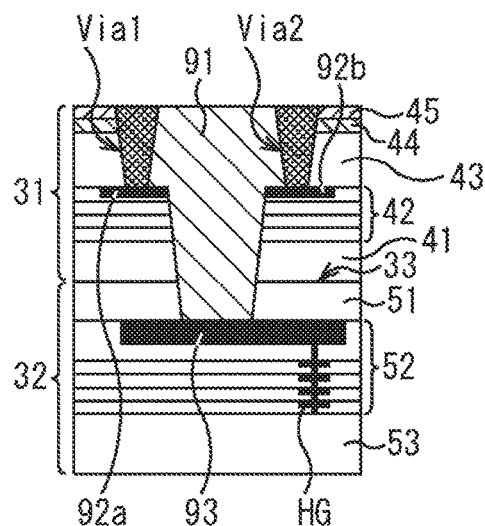

Then, as shown in FIG. 15D, the opening 94 is filled with the metal material such as tungsten (W), aluminum (Al), copper (Cu) and the like to form the connection conductor 91.

As described above, the through vias Via1 and Via2 at both sides of the connection conductor 91 are formed by the similar method of producing the pad surrounding guard ring PG from a light incident surface side (a rear surface), whereby a margin for bonding misalignment is unnecessary. Therefore, a unit size can be reduced.

As the through vias Via1 and Via2 are formed by the similar method of producing the pad surrounding guard ring PG from the light incident surface side (the rear surface), the through vias Via1 and Via2 have a forward tapered shape. In this manner, light is inhibited from being incident on the photo diodes PD, a flare component incident on the photo diodes PD can be reduced.

Furthermore, when the silicon layer 43 and the like are etched between the through vias Via1 and Via2, the through vias Via1 and Via2 each functions as an etching stopper. Thus, etching is easily done.

As described above, the solid state imaging apparatus 1 according to the first embodiment includes the pad surrounding guard ring PG that is an insulation structure formed by trenching in a longitudinal direction to penetrate through at least the silicon layer 43 at a light receiving surface side and burying it with at least one of an insulation substance, i.e., the material of the antireflection film, the Si compound, the copolymerization based resin material and air. The pad surrounding guard ring PG has a forward tapered shape where a top diameter at the light receiving surface side of the silicon layer 43 is greater than a bottom diameter at a bottom portion. In this manner, a flare component incident on the photo diodes PD can be reduced.

3. Second Embodiment

<Embodiment of Non-Laminated Type Solid State Imaging Apparatus>

In the above-described first embodiment, the pad surrounding guard ring PG according to the present disclosure is applied to the laminated type solid state imaging apparatus formed by bonding two semiconductor substrates. The pad surrounding guard ring PG according to the present disclosure may be applied to a non-laminated and back illumination type solid state imaging apparatus in the related art.

Figure 16:
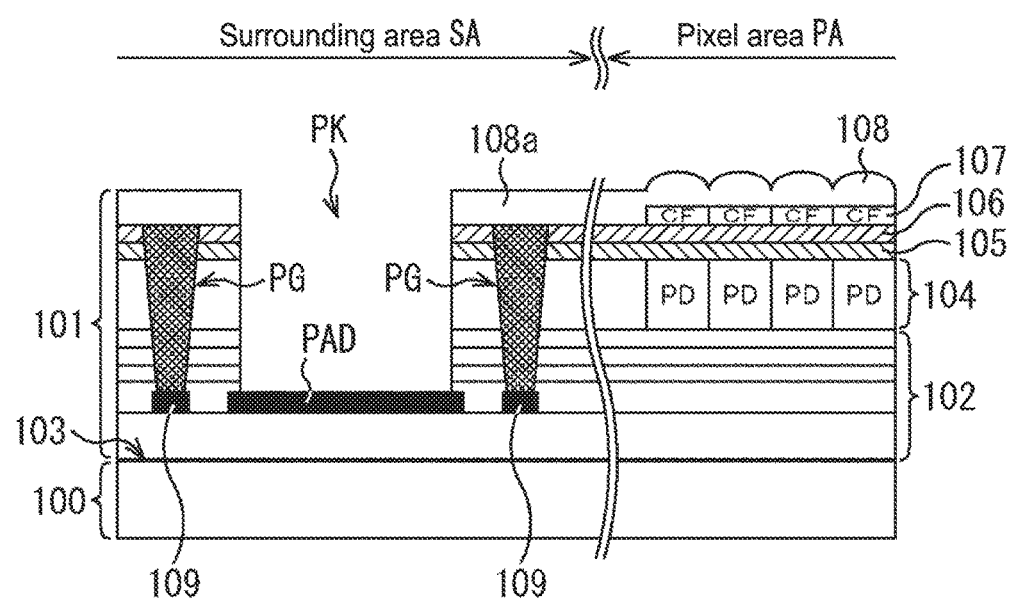
FIG. 16 is a cross sectional configuration view around a pad opening in a non-laminated type solid state imaging apparatus.

FIG. 16 is a cross sectional configuration view around a pad opening PK at a predetermined position of the solid state imaging apparatus 1, when the solid state imaging apparatus 1 is the non-laminated and back illumination type solid state imaging apparatus.

In FIG. 16, a support substrate 100 as the first semiconductor substrate is bonded to a multilayer wiring layer 102 of a silicon substrate 101 as the second semiconductor substrate at a bonding interface 103.

On an upper surface of the multilayer wiring layer 102 of the silicon substrate 101, a silicon layer 104 is disposed. In a pixel area PA of the silicon layer 104, a photo diode PD is formed per pixel unit.

On an upper surface of the silicon layer 104, an antireflection film 105 and an insulation film 106 are formed in this order. As the material for the antireflection film 105 and the insulation film 106, a variety of materials cited referring to FIG. 6 can be used.

On an upper side of the insulation film 106 in the pixel area PA, a color filter (CF) 107 of any of R, G or B are formed per pixel unit. The colors of the color filter 107 are arranged by the Bayer array, for example.

On an upper side of the color filter 107 in the pixel area PA, on-chip lenses 108 are formed per pixel unit. As a material used for the on-chip lenses 108, there is used a copolymerization based resin material such as a styrene based resin, an acryl based resin and a siloxane based resin.

On the other hand, in the surrounding area SA, as no color filter 107 is formed, a planarization film 108a made of the material used for the on-chip lenses 108 is formed.

In the surrounding area SA, the pad opening PK is open from an interface of a rear surface to a lowermost wiring layer of the multilayer wiring layer 102 in a longitudinal direction. At the lowermost wiring layer of the multilayer wiring layer 102, the electrode pad portion PAD is formed.

The pad surrounding guard ring PG made of an insulation material (a non-metal material) around the pad opening PK (both sides in FIG. 16) is penetrated and buried into an isolated pad 109 positioned at the lowermost wiring layer of the multilayer wiring layer 102. If the pad surrounding guard ring PG is formed of a metal material, side walls are damaged upon wire bonding, thereby propagating cracks. According to the embodiment of the present disclosure, when the pad surrounding guard ring PG is formed with a non-metal material in a longitudinal direction, boundaries where a damage propagates can be severed to inhibit propagation of cracks.

When a bonding wire is contacted with the silicon layer 104 at the side wall, a current leak path may be formed upon driving. The pad surrounding guard ring PG shown in FIG. 16 made of a non-metal material can be electrically insulated, thereby preventing the leak.

Although FIG. 16 shows the pad surrounding guard ring PG disposed around the pad opening PK, the chip surrounding guard ring CG disposed at a side of the scribe area LA is also formed similarly. In this manner, propagation of cracks can be inhibited and chipping can be prevented.

<Production Method>

Referring to FIGS. 17A to 17D and 18A to 18D, a method of producing the solid state imaging apparatus 1 shown in FIG. 16 will be illustrated.

Figure 17A:
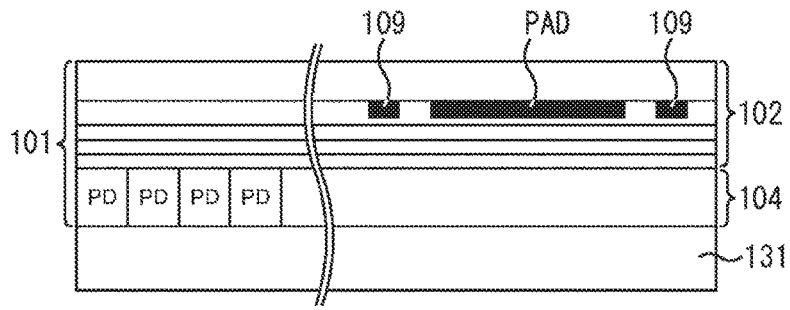
FIGS. 17A to 17D are views for illustrating a method of producing the solid state imaging apparatus shown in FIG. 16.

Firstly, as shown in FIG. 17A, the photo diodes PD are formed in the silicon layer 104 on a holding substrate 131. Thereafter, the multilayer wiring layer 102 including the electrode pad portion PAD and the isolated pad 109 is formed on the silicon layer 104.

Figure 17B:
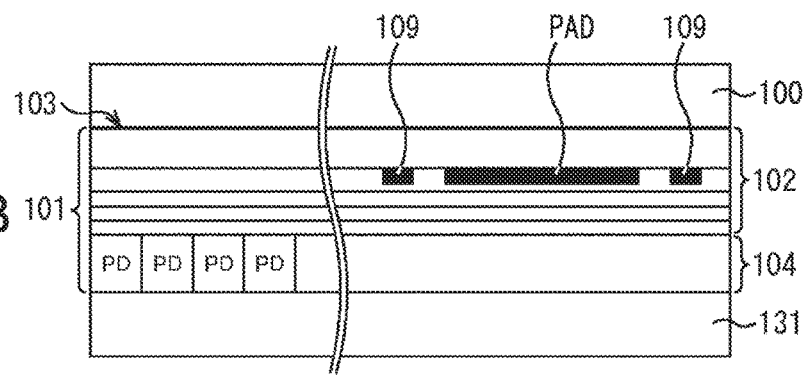

Then, as shown in FIG. 17B, the support substrate 100 is bonded to the upper side of the multilayer wiring layer 102 with a plasma bonding or a bonding agent at a bonding interface. The boundary between the support substrate 100 and the multilayer wiring layer 102 is the bonding interface 103.

Figure 17C:
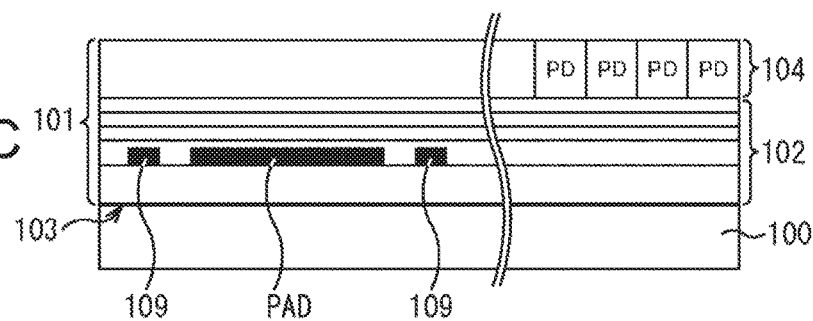

Next, as shown in FIG. 17C, the whole substrate including the support substrate 100 is inverted. Thereafter, the holding substrate 131 that forms an upper side after inversion is peeled.

Figure 17D:
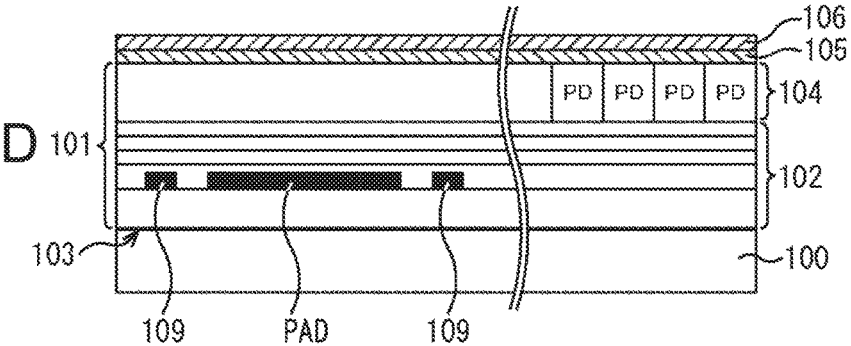

After the holding substrate 131 is peeled, as shown in FIG. 17D, the antireflection film 105 and the insulation film 106 are formed on the upper surface of the silicon layer 104 that forms an uppermost side (rear surface) in this order.

Figure 18A:
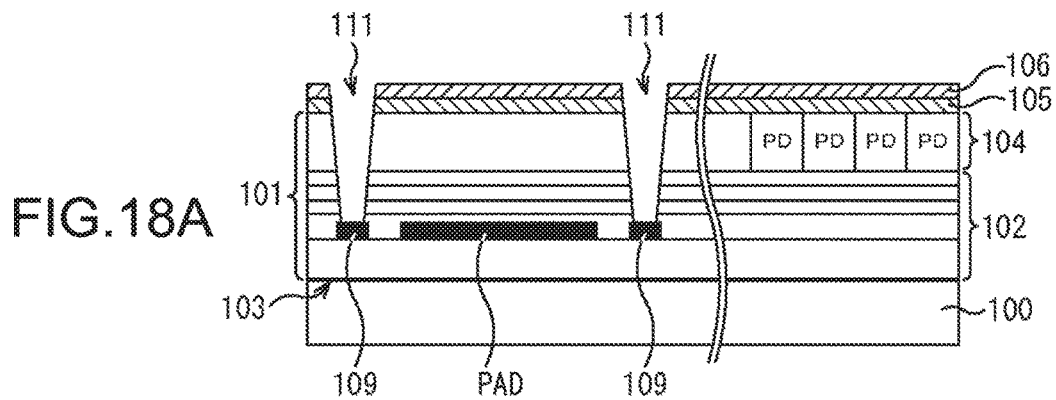
FIGS. 18A to 18D are views for illustrating a method of producing the solid state imaging apparatus shown in FIG. 16.

Next, as shown in FIG. 18A, an area to be the pad surrounding guard ring PG is removed by a dry etching method, for example, to form an opening 111.

Figure 18B:
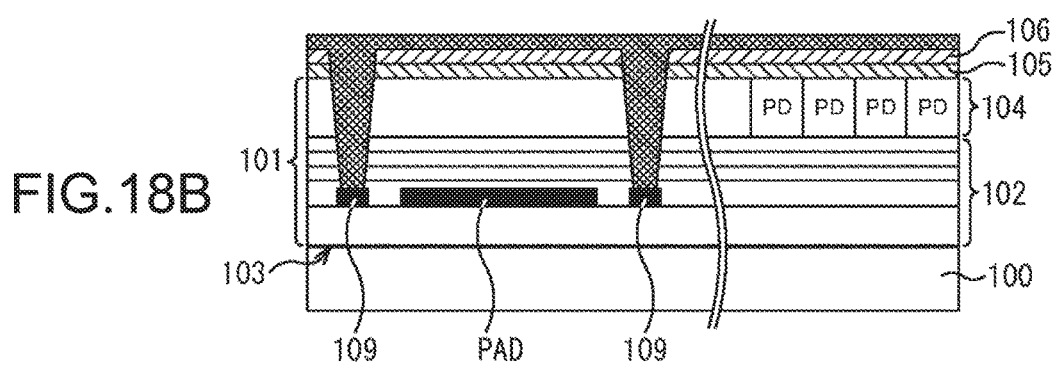

Then, as shown in FIG. 18B, the insulation material is used to form a film over an entire upper surface of the silicon substrate 101 by the CVD method, for example, and the opening 111 to be the pad surrounding guard ring PG is filled with the insulation material.

Figure 18C:
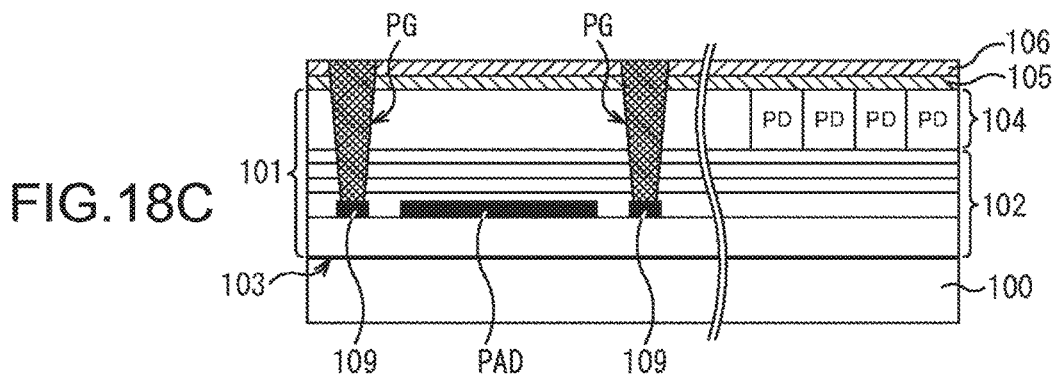

An uppermost insulation material on the silicon substrate 101 is removed by a CMP treatment, as shown in FIG. 18C, such that the pad surrounding guard ring PG is formed.

In this embodiment, the pad surrounding guard ring PG is formed by filling the insulation material of the material used for the antireflection film 44, the Si compound used for the insulation film 45 and the copolymerization based resin material used for the on-chip lenses 47. As described above, it may be combined with air gap or only air gap may be used.

Figure 18D:
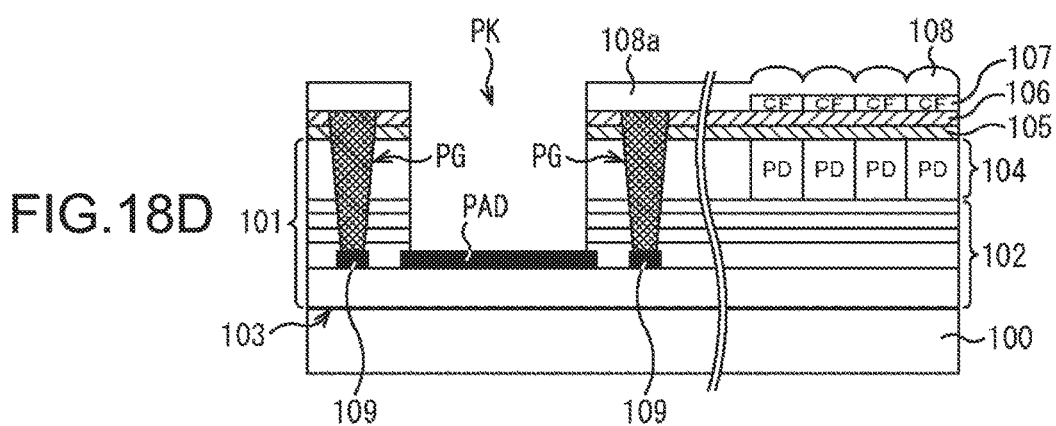

Thereafter, as shown in FIG. 18D, the color filter 46 and the on-chip lenses 47 are formed in the pixel area PA. In the surrounding area SA, the multilayer wiring layer 102, the silicon layer 104, the antireflection film 105, the insulation film 106 and a film 108a above the electrode pad portion PAD are removed by a dry etching method, for example, and the pad opening PK is formed.

In this way, the solid state imaging apparatus 1 in FIG. 16 can be produced.

The chip surrounding guard ring CG disposed at the side of the scribe area LA can be formed similar to the above-described pad surrounding guard ring PG.

As described above, the pad surrounding guard ring PG is formed from a rear surface (a light incident surface side) after the support substrate 100 and the silicon substrate 101 are bonded. As shown in FIG. 16, the pad surrounding guard ring PG has a forward tapered shape where a top diameter at a light incident surface side on an upper side is greater than a bottom diameter at an electrode pad portion PAD side.

As the pad surrounding guard ring PG has the forward tapered shape, light is inhibited from being incident on the photo diodes PD if the incident light is hit on the pad surrounding guard ring PG and is reflected. In this manner, using the pad surrounding guard ring PG according to the embodiment of the present disclosure, a flare component incident on the photo diodes PD can be reduced.

<Alternative Embodiments of Pad Surrounding Guard Rings PG Having Varying Depths>

Figure 19A:
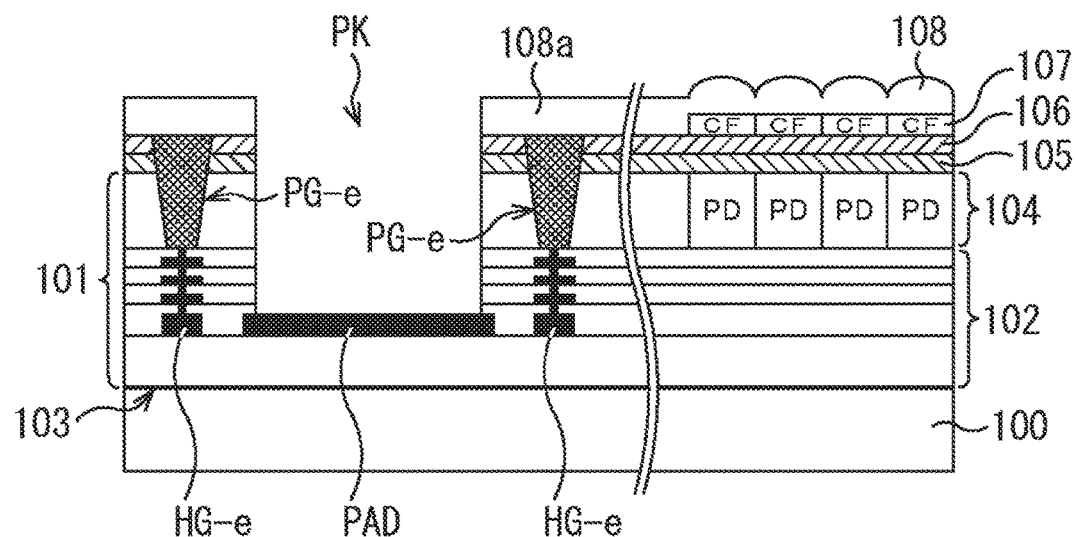
FIGS. 19A and 19B illustrate alternative embodiments of pad surrounding guard rings having varying depths.
Figure 19B:
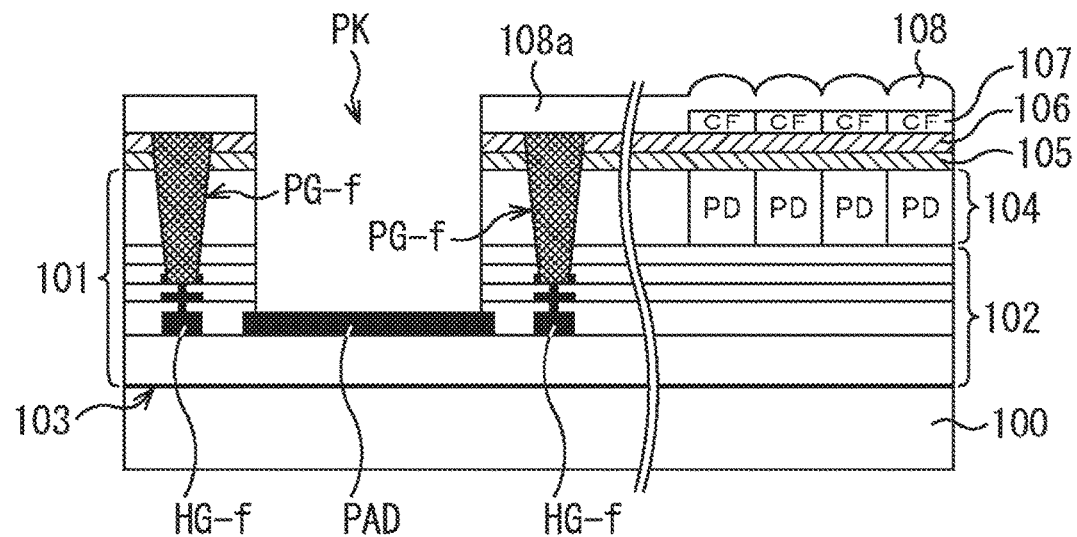

FIGS. 19A and 19B illustrate alternative embodiments of pad surrounding guard rings having varying depths in the non-laminated type solid state imaging apparatus 1.

In the non-laminated type solid state imaging apparatus 1, the depth of the pad surrounding guard ring PG may be such that at least the silicon layer 104 is trenched.

FIG. 19A shows an embodiment where the pad surrounding guard rig PG-e is formed by forming an opening only in the silicon layer 104 and burying the opening with the insulation material. Under the pad surrounding guard ring PG-e, the wiring guard ring HG-e is disposed.

FIG. 19B shows an embodiment that the pad surrounding guard ring PG-f is formed by forming an opening in the silicon layer 104 and a part of the multilayer wiring layer 102 and burying the opening with the insulation material, and the wiring guard ring HG-f is disposed in the rest of the multilayer wiring layer 102.

<Embodiment of Wiring for Drawing Power Source>

Figure 20A:
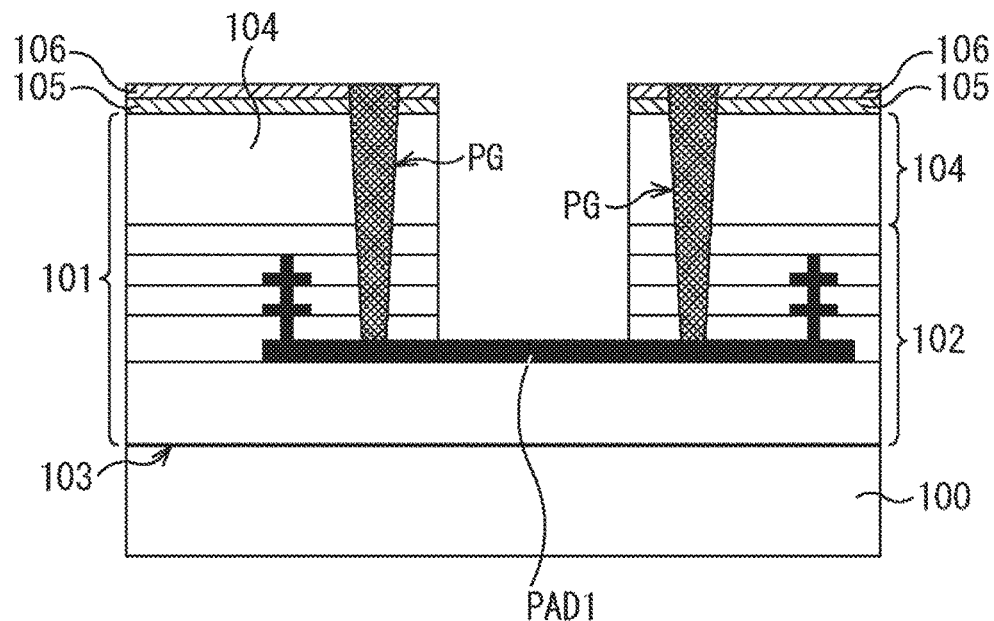
FIGS. 20A and 20B each shows an embodiment of a wiring for drawing a power source from an electrode pad portion.
Figure 20B:
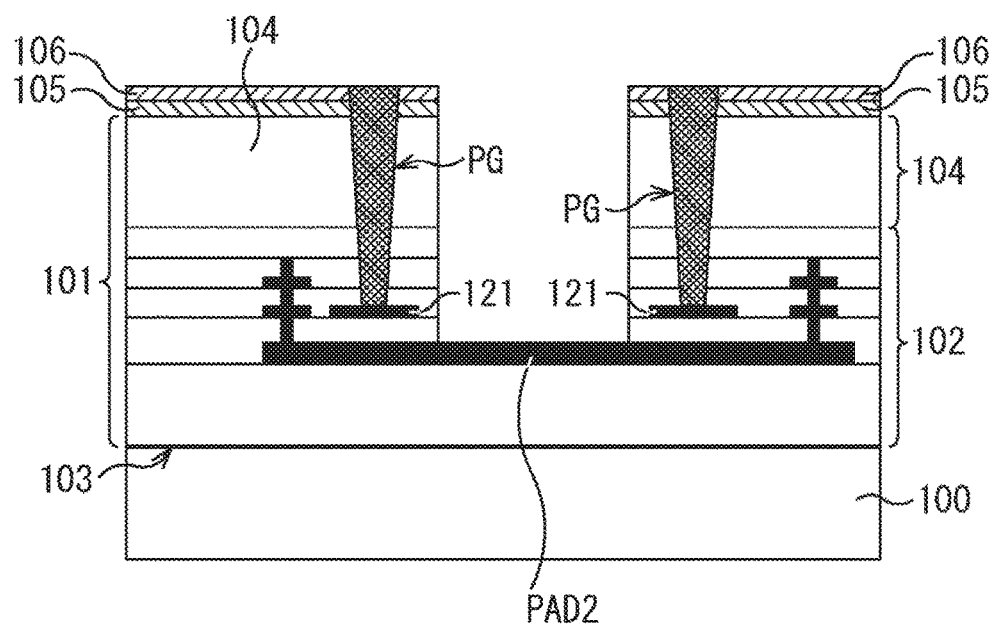

FIGS. 20A and 20B each shows an embodiment of a wiring for drawing a power source from the electrode pad portion PAD in the non-laminated type solid state imaging apparatus 1.

FIG. 20A shows an embodiment where the electrode pad portion PAD shown in FIG. 16 is extended to connect to the isolated pad 109 at the bottom of the pad surrounding guard ring PG to form an electrode pad portion PAD1 that is also used as the wiring for drawing a power source.

FIG. 20B shows an embodiment where the pad surrounding guard ring PG is formed up to the second wiring layer from the bottom of the multilayer wiring layer 102, an isolated pad 121 are formed, the electrode pad portion PAD shown in FIG. 16 is extended to form an electrode pad portion PAD2 that is also used as the wiring for drawing a power source in the lowermost layer of the multilayer wiring layer 102. Using the isolated pad 109 shown in FIG. 16 and the isolated pad 121 shown in FIG. 20B, the wiring layers connected to the pad surrounding guard ring PG is isolated, the PID can be prevented.

As described above, the solid state imaging apparatus 1 according to the second embodiment includes the pad surrounding guard ring PG that is an insulation structure formed by trenching and penetrating at least the silicon layer 104 at a light receiving surface side in a longitudinal direction and burying it with at least one of an insulation substance, i.e., the material of the antireflection film, the Si compound, the copolymerization based resin material and air. The pad surrounding guard ring PG has a forward tapered shape where a top diameter at the light receiving surface side of the silicon layer 104 is greater than a bottom diameter at a bottom portion. In this manner, a flare component incident on the photo diodes PD can be reduced.

3. Third Embodiment

<Guard Ring Structure>

In the above-described embodiments, the pad surrounding guard ring PG and the chip surrounding guard ring CG each has the forward tapered shape where the top diameter at the light incident surface side is greater than the bottom diameter at the bottom portion. Other structure of the pad surrounding guard ring PG and the chip surrounding guard ring CG will be described below.

Figure 21:
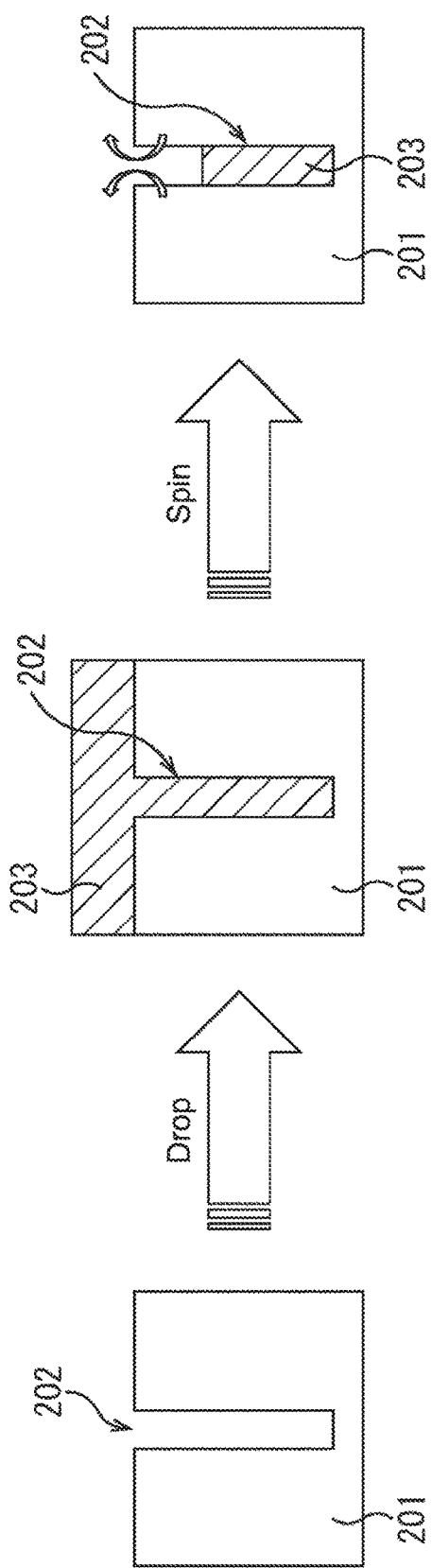
FIG. 21 illustrates a trench structure in the related art.

The pad surrounding guard ring PG and the chip surrounding guard ring CG can be formed by forming an opening 202 having a high aspect ratio to the semiconductor substrate 201 with a dry etching process, and spin-coating a coating material 203 by a spin coating method to fill the opening 202 with the coating material 203, as shown in FIG. 21.

However, depending on the shape of the opening 202, the coating material 203 at an upper portion of the opening 202 may be discharged due to centrifugal force by spin, as shown in FIG. 21. Once the coating material 203 at the upper portion of the opening 202 is discharged and no coating material 203 exists thereon, a bonding property between the coating material 203 and a film-forming material is decreased, which may cause film peeling.

Figure 22:
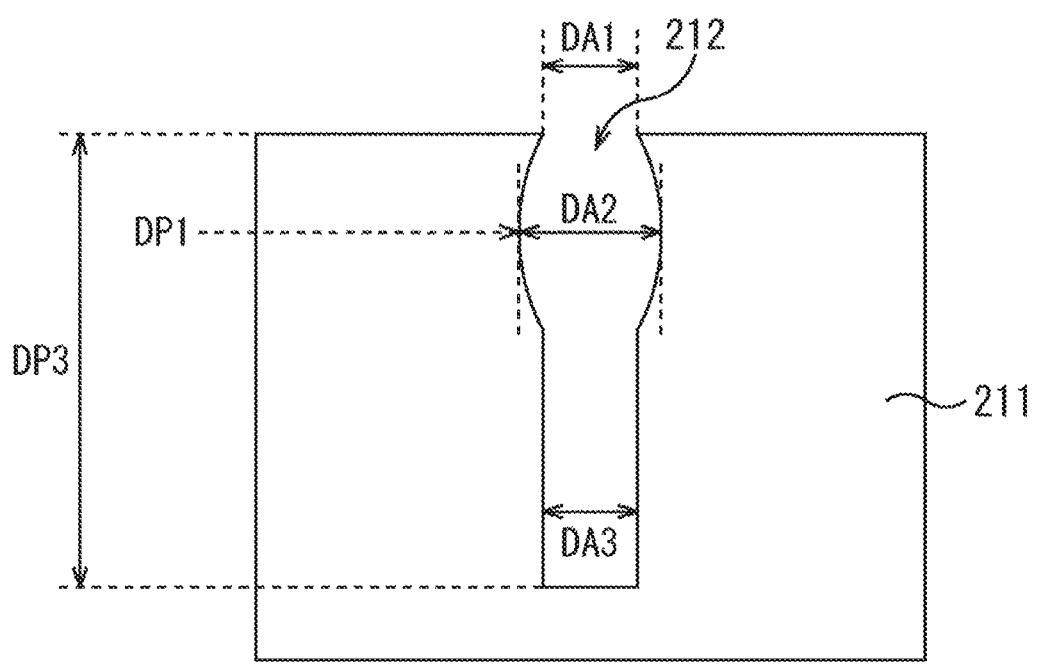
FIG. 22 illustrates a trench structure according to a third embodiment.

According to the third embodiment, an opening 212 for the pad surrounding guard ring PG or the chip surrounding guard ring CG is formed as shown in FIG. 22. Specifically, the opening 212 is formed in a semiconductor substrate 211 such that an upper portion of a total depth DP3 of the opening 212 has a bowing profile. Herein, the bowing profile refers to a shape that the opening 212 has an uppermost diameter DA1, a maximum diameter DA2 and a lower diameter DA3; the maximum diameter DA2 being at a depth position DP1, the uppermost diameter DA1 being above the depth position DP1 and the lower diameter DA3 being lower the depth position DP1; the uppermost diameter DA1 and the lower diameter DA3 being narrower than the maximum diameter DA2. Thus, the uppermost diameter DA1 is smaller than the maximum diameter DA2 in the opening 212. The lower diameter DA3 may have a same size as the uppermost diameter DA1.

By forming the opening 212 in the semiconductor substrate 211 such that the upper portion has the bowing profile, when the coating material 203 is spin-coated by a spin coating method, the coating material 203 is sprung back from an upper surface of the opening 212 and remains in the opening 212. Accordingly, when the opening 212 has a high aspect ratio, a burying property of the coating material 203 can be improved. When the burying property of the coating material 203 is improved in the opening 212 having a high aspect ratio, a bonding property between the coating material 203 and a film-forming material is ensured to prevent film peeling.

Also, when the coating material 203 formed on the upper surface of the semiconductor substrate 211 is used as a planarization film in the pixel area PA, the opening 212 can be filled with the coating material 203 while a film thickness is maintained, thereby holding a light collecting property. In addition, the opening 212 can be filled with the coating material 203 by a spin coating method, whereby the pad surrounding guard ring PG and the chip surrounding guard ring CG can be formed at a low temperature.

Figure 24:
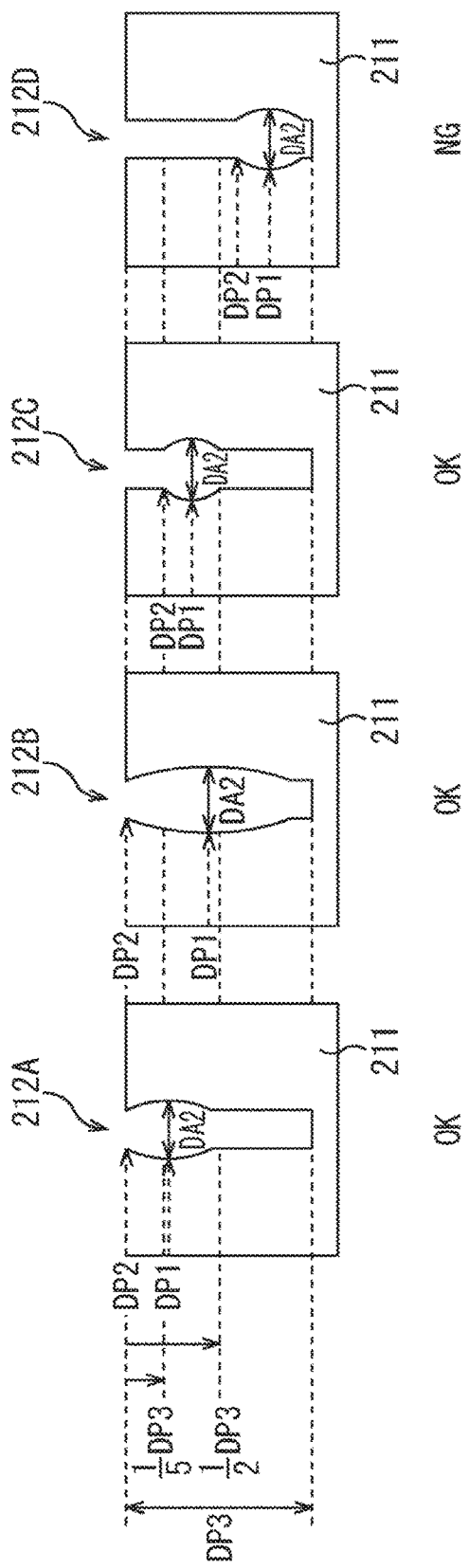
FIG. 24 illustrates the trench structure according to the third embodiment in detail.

FIG. 24 illustrates a position of the bowing profile to provide the above-described advantages.

In the bowing profile that is bulged externally, the depth position DP1 having the maximum diameter DA2 may be positioned from the uppermost surface of the semiconductor substrate 211 to ½ of the total depth DP3 of the opening 212, and a depth position DP2 of an uppermost portion of the bowing profile may be positioned from the uppermost surface of the semiconductor substrate 211 to ⅕ of the total depth DP3 of the opening 212.

Figure 23:
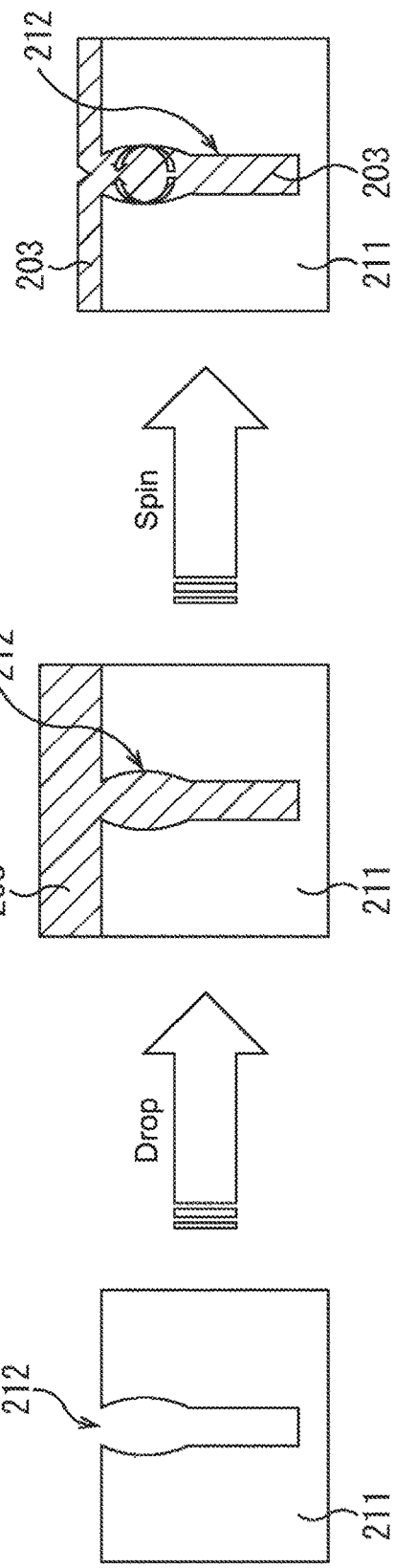
FIG. 23 illustrates an effect of the trench structure according to the third embodiment.

For example, each of openings 212A to 212C shown in FIG. 24 has the depth position DP1 having the maximum diameter DA2 positioned from the uppermost surface of the semiconductor substrate 211 to ½ of the total depth DP3 of the opening 212 and the depth position DP2 of the uppermost portion of the bowing profile positioned from the uppermost surface of the semiconductor substrate 211 to ⅕ of the total depth DP3 of the opening 212. Therefore, the advantages illustrated in FIG. 23 can be provided. In each of the openings 212A and 212B, the depth position DP2 of the uppermost portion of the bowing profile equals to the uppermost surface of the semiconductor substrate 211.

On the other hand, an opening 212D shown in FIG. 24 has the depth position DP1 having the maximum diameter DA2 positioned deeper than ½ of the total depth DP3 of the opening 212 and the depth position DP2 of the uppermost portion of the bowing profile positioned deeper than ⅕ of the total depth DP3 of the opening 212. Therefore, no advantages illustrated in FIG. 23 can be provided.

Figure 25:
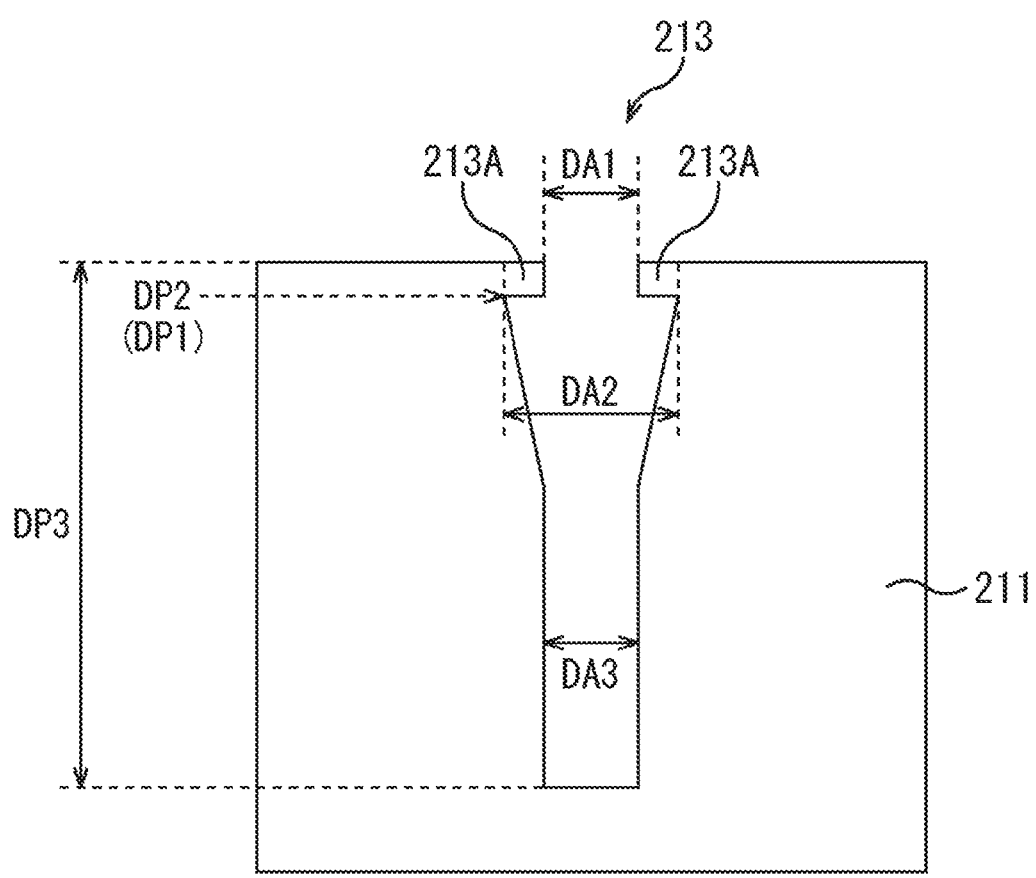
FIG. 25 illustrates another trench structure according to the third embodiment.

In order to prevent discharge of the coating material 203, an opening having a peaked shape shown in FIG. 25 may be used other than the above-described bowing profiles. The peaked shape of the opening 213 refers to a shape that a peaked portion 213A internally protruded is disposed at the uppermost surface such that the uppermost diameter DA1 is narrower than the maximum diameter DA2 under the peaked portion 213A and the depth position DP1 having the maximum diameter DA2 is positioned at a deep portion of the semiconductor substrate 211. Also, in this case, the depth position DP2 of the uppermost portion of the peaked shape may be positioned from the uppermost surface of the semiconductor substrate 211 to ⅕ of the total depth DP3 of the opening 213. In the peaked shape, the depth position DP1 having the maximum diameter DA2 equals to the depth position DP2 of the uppermost portion of the peaked shape. Accordingly, when the depth position DP2 of the uppermost portion of the peaked shape is within ⅕ of the total depth DP3, the depth position DP1 having the maximum diameter DA2 is also within ½ of the total depth DP3.

In addition, in the opening 213 having the peaked shape, a diameter lower than the depth position DP1 having the maximum diameter DA2 may be changed straightly in terms of a sectional shape as shown in FIG. 25, or may be changed curvedly.

<Method of Producing Chip Surrounding Guard Ring CG>

Referring to FIGS. 26A to 26F, a method of producing a chip surrounding guard ring CG having a bowing profile.

Figure 26:
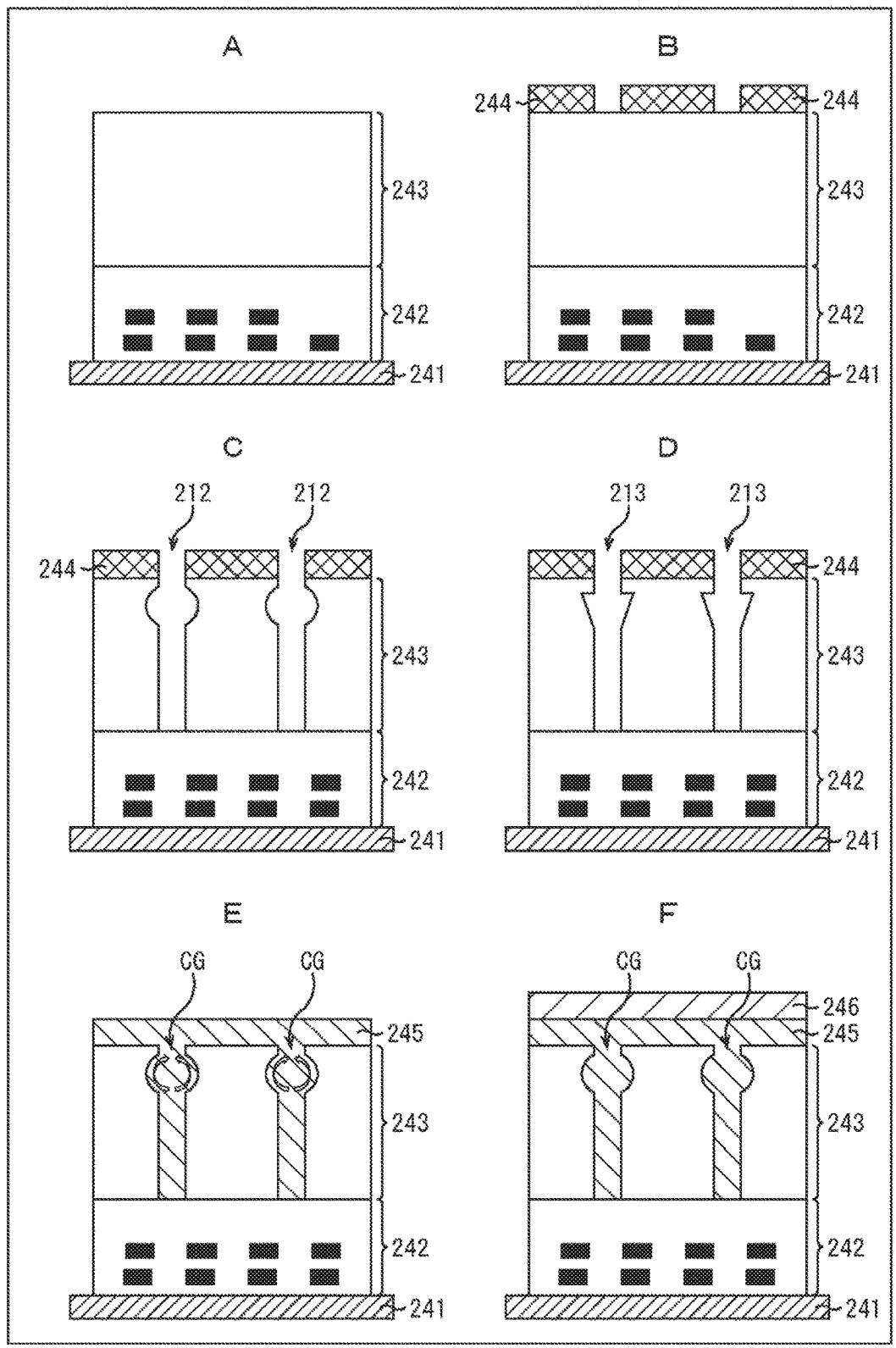
FIG. 26 illustrates a method of producing a chip surrounding guard ring according to the third embodiment.

Firstly, as shown in FIG. 26A, a support substrate 241 used as the first semiconductor substrate is bonded to a multilayer wiring layer 242 formed on a silicon substrate 243 used as the second semiconductor substrate. Thereafter, the silicon substrate 243 is thinned. On a pixel area PA of the silicon substrate 243, photo diodes PD are formed per pixel unit. The area shown in FIG. 26A is a surrounding area SA where the chip surrounding guard ring CG is formed, and no photo diodes PD are therefore formed. FIG. 26A corresponds to FIG. 17C above.

Next, as shown in FIG. 26B, a resist 244 is patterned on an upper surface of the silicon substrate 243 by a lithography technique.

Then, as shown in FIG. 26C, an area for forming the chip surrounding guard ring CG of the silicon substrate 243 is removed by a dry etching method to form an opening 212 each having a bowing profile. The process conditions of the dry etching for forming the opening 212 having the bowing profile are as follows: gas of $SF_6$, flow rate of 200 sccm, a pressure of 100 mTorr, and a bias voltage of 300V, for example. The process conditions are illustrative only, and the opening can be formed using other conditions.

When the chip surrounding guard ring CG not having the bowing profile but having the peaked shape shown in FIG. 25 is formed, an opening 213 having a peaked shape is formed on the silicon substrate 243 by a dry etching method, as shown in FIG. 26D.

After the resist 244 on the upper surface of the silicon substrate 243 is removed, a coating material 245 is spin-coated by a spin coating method as shown in FIG. 26E. Thus, the opening 212 is filled with the coating material 245, thereby forming the chip surrounding guard ring CG. Also, on the upper surface of the silicon substrate 243, a planarization film is formed with the coating material 245.

Upon the coating, as each opening 212 has the bowing profile, the coating material 245 is sprung back from an upper surface of the opening 212 and remains in the opening 212. Accordingly, when each opening 212 has a high aspect ratio, the coating material 245 can be filled. The coating material 245 can have a viscosity of 1 to 3 mP·s (Pascal seconds).

Finally, as shown in FIG. 26F, an on-chip material 246 is formed on an upper surface of the planarization film formed with the coating material 245.

As shown in FIG. 16, the on-chip material 246 is formed in a lens shape per pixel unit in the pixel area PA, but the on-chip material 246 is planarized in the surrounding area SA. In FIGS. 26A to 26F, although no color filter is formed on the surrounding area SA, but a color filter may be formed on the surrounding area SA.

5. Fourth Embodiment

<Application to Trench Between Pixels>

The structure where the substrate is trenched in the depth direction in the bowing profile or the peaked shape can be applied to a trench between pixels for separating the photo diodes PD in addition to the above-described guard ring including the pad surrounding guard ring PG and the chip surrounding guard ring CG.

Figure 27:
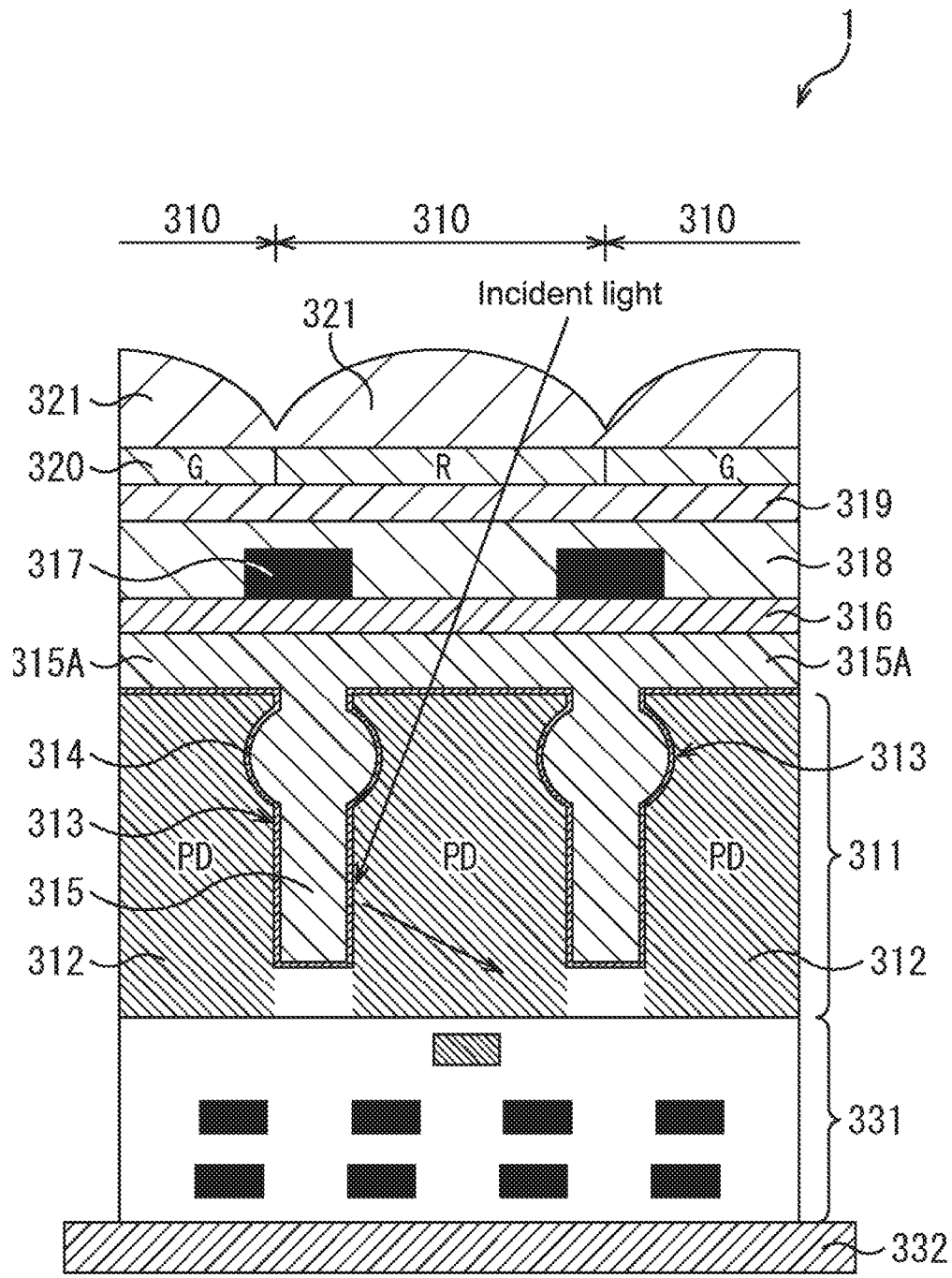
FIG. 27 is a view showing a pixel structure according to a fourth embodiment.

FIG. 27 shows a sectional view of a back illumination type pixel structure including trenches between pixels to which the trench structures having the bowing profiles are applied.

A solid state imaging apparatus 1 includes a silicon substrate 311, a multilayer wiring layer 331 formed on a surface side (lower in FIG. 27) and a support substrate 332.

The silicon substrate 311 is formed of a P type (first conductor) silicon substrate, for example. In the silicon substrate 311, each N type (second conductor) semiconductor area 312 is formed per pixel 310, thereby forming each photo diode PD per pixel unit.

Between the photo diodes PD formed in the respective pixels 310, trenches 313 between pixels each having a bowing profile are formed.

A pinning film 314 is formed on inner surfaces of the trenches 313 between pixels and an upper surface of the silicon substrate 311. In order to form a positive charge (a hole) accumulation area in an interface of the silicon substrate 311 to prevent a generation of a dark current, the pinning film 314 is formed using a high dielectric material having a negative fixed charge. The pinning film 314 also functions as the antireflection film in the upper surface of the silicon substrate 311.

The pinning film 314 is formed of hafnium oxide ($HfO_2$), for example. Alternatively, the pinning film 314 may be formed of zirconium dioxide ($ZrO_2$), oxide tantalum ($Ta_2O_5$) or the like.

Insides of the trenches 313 between pixels coated with the pinning film 314 are filled with a transparent insulation material 315. As the transparent insulation material 315 is formed on a whole rear surface of the silicon substrate 311 above the pinning film 314, a transparent insulation film 315A is formed. As the transparent insulation material 315, a material having a refractive index smaller than that of the silicon substrate 311 is used. In this way, as shown in FIG. 27, as an incident light is reflected on the trenches 313 between pixels, color mixing, flare and blooming caused by a leakage of the incident light from adjacent pixels 310.

On an upper surface of the transparent insulation film 315A, an oxide film 316 such as a LTO (Low Temperature Oxide) film, a plasma TEOS film or the like is formed.

At pixel boundaries on the oxide film 316, light shielding films 317 are formed. As the light shielding films 317, any light shielding material including tungsten (W), aluminum (Al) or copper (Cu) can be used.

On an entire upper surface of the oxide film 316 including the light shielding films 317, an insulation film 318 is formed. As a material of the insulation film 318, silicon oxide ($SiO_2$), silicon nitride (SiN), oxynitride silicon (SiON) or the like can be used.

On an upper surface of the insulation film 318, a planarized film 319 is formed. On an upper side of the planarized film 319, a color filter 320 of any of R (Red), G (Green) or B (Blue) is formed per pixel unit. Each color of Red, Green and Blue in the color filter 320 are arranged by the Bayer array, for example. Other array may be used.

On an upper side of the color filter 320, on-chip lenses 321 are formed per pixel unit. As a material used for the on-chip lenses 321, there is used a resin based material such as a styrene based resin, an acryl based resin, a styrene-acryl copolymerization based resin or a siloxane based resin. The on-chip lenses 321 collect an incident light. The incident light collected by the on-chip lenses 321 is effectively incident on the photo diodes PD via the color filter 320.

The pixel structure of the solid state imaging apparatus 1 according to the fourth embodiment can be configured as described above.

In the pixel structure shown in FIG. 27, a depth of each trench 313 between pixels is on the way of the silicon substrate 311. However, the depth of each trench 313 between pixels may penetrate the silicon substrate 311, or may be trenched to the multilayer wiring layer 331 under the silicon substrate 311.

<Production Method>

Referring to FIGS. 28A to 28E and FIGS. 29A to 29D, a method of producing the solid state imaging apparatus 1 shown in FIG. 27 will be described.

Figure 28:
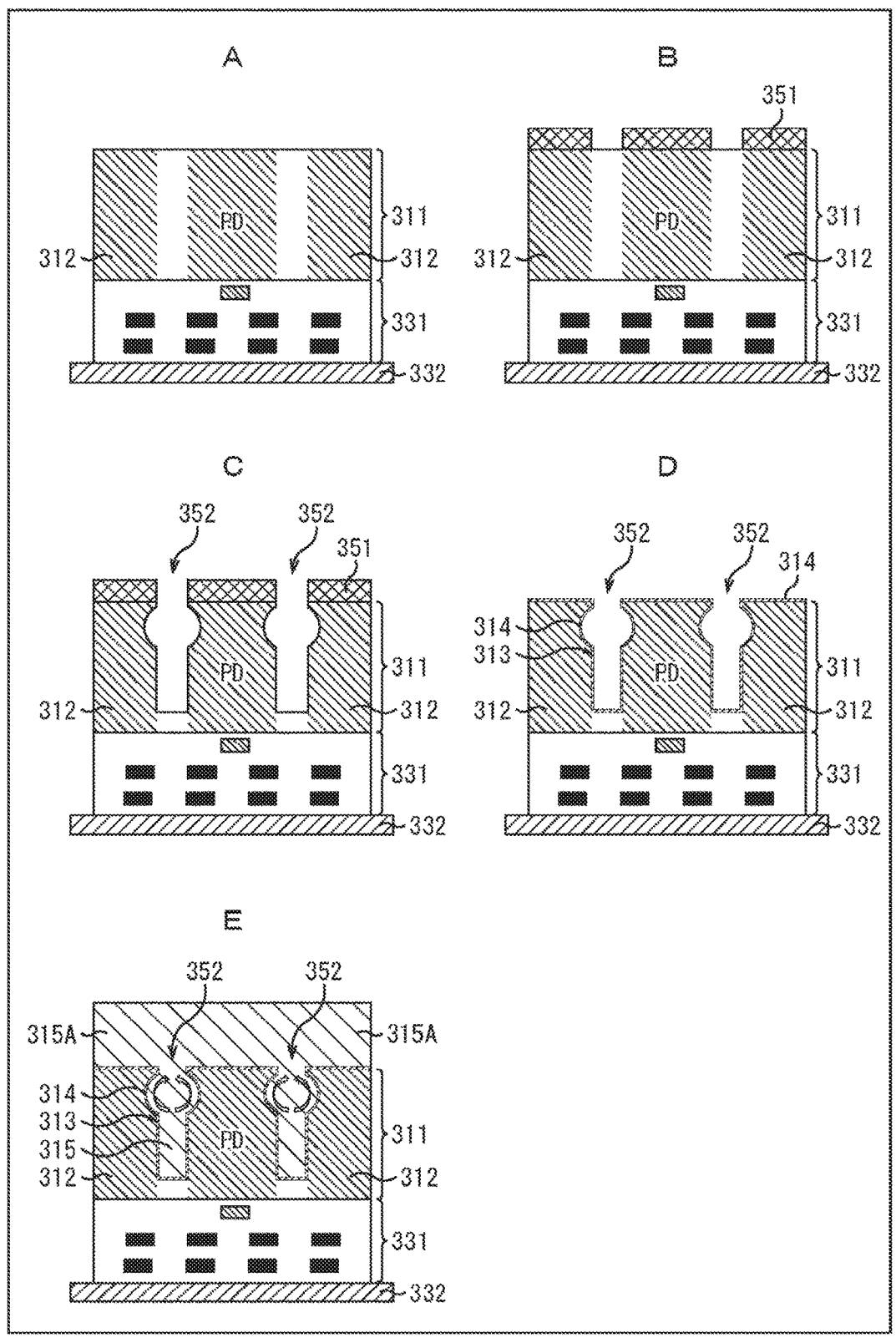
FIG. 28 illustrates a method of producing a chip surrounding guard ring according to the fourth embodiment.

Firstly, as shown in FIG. 28A, the support substrate 332 as the first semiconductor substrate is bonded to the multilayer wiring layer 331 of the silicon substrate 311 as the second semiconductor substrate, and the silicon substrate 311 is then thinned. As the silicon substrate 311 is thinned, photo diodes PD formed per pixel within the silicon substrate 311 are positioned near a boundary at a rear surface of the silicon substrate 311.

Next, as shown in FIG. 28B, resists 351 are patterned on the upper surface of the silicon substrate 311 by a lithography technology.

Then, as shown in FIG. 28C, an opening 352 having the bowing profile is formed between the photo diodes PD of the silicon substrate 311 by a dry etching method, for example. The process conditions of the dry etching for forming the opening 352 having the bowing profile are as follows: gas of $SF_6$, flow rate of 500 sccm, a pressure of 100 mTorr, and a bias voltage of 300V, for example. The process conditions are illustrative only, and the opening can be formed using other conditions.

Next, after the resists 351 on the upper surface of the silicon substrate 311 are removed, as shown in FIG. 28D, a pinning film 314 is formed on an inner wall surface of the opening 352 and the upper surface of the silicon substrate 311.

Next, the transparent insulation material 315 is spin-coated by a spin coating method such that the opening 352 is filled with the transparent insulation material 315, the trenches 313 between pixels are formed and the transparent insulation film 315A is formed on the upper surface of the pinning film 314, as shown in FIG. 28E. In the coating process, as each opening 352 has the bowing profile, as described referring to FIG. 23, the transparent insulation material 315 is sprung back from the upper surface of each opening 352 and remains in each opening 352. Accordingly, when each opening 352 has a high aspect ratio, the transparent insulation material 315 can be filled. The transparent insulation material 315 can have a viscosity of 1 to 3 mP·s.

Figure 29:
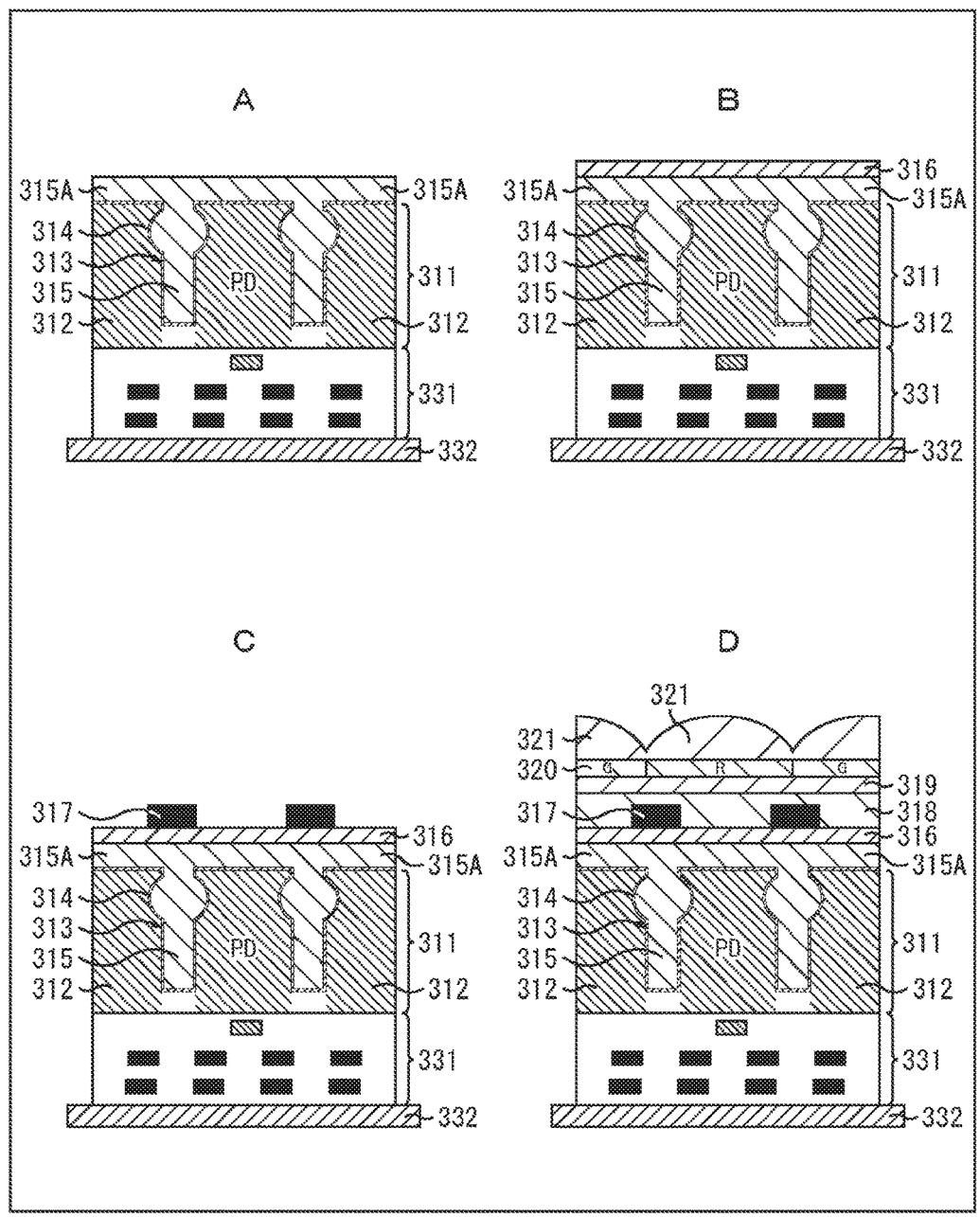
FIG. 29 illustrates a method of producing a chip surrounding guard ring according to the fourth embodiment.

Thereafter, as shown in FIG. 29A, the transparent insulation film 315A formed on the upper surface of the pinning film 314 of the silicon substrate 311 is etched back to a predetermined height.

As shown in FIG. 29B, an oxide film 316 is formed on the upper surface of the transparent insulation film 315A. As shown in FIG. 29C, the light shielding films 317 are formed at boundaries between the pixels above the oxide film 316.

Thereafter, as shown in FIG. 29D, the insulation film 318, the planarized film 319, the color filter 320 and the on-chip lenses 321 are formed in this order.

As described above, according to the method of producing the solid state imaging apparatus 1 in the fourth embodiment, each opening 352 that becomes each trench 313 between pixels is formed as the bowing profile and is filled with the transparent insulation material 315 by a spin coating method. As each opening 352 that becomes each trench 313 between pixels is formed as the bowing profile, the transparent insulation material 315 coated is sprung back from the upper surface of each opening 352 and remains in each opening 352. Accordingly, when each opening 352 has a high aspect ratio, the transparent insulation material 315 can be filled, thereby decreasing a failure caused by a burying defect.

As described above, according to the solid state imaging apparatuses in the third and fourth embodiments, the insulation structure can be disposed as the guard ring or the trench; the insulation structure having a maximum diameter positioned deeper than and is smaller than the uppermost surface of the semiconductor substrate. By utilizing the insulation structure having the above-described configuration, a burying property of the insulation structure filled within the semiconductor substrate can be improved.

The support substrate 241 or 322 in the third and fourth embodiments can be a logic substrate having logic circuits. In other words, although the third and fourth embodiments illustrate the non-laminated type solid state imaging apparatus similar to the second embodiment, the trench structure according to the embodiments of the present disclosure is applicable to the laminated type solid state imaging apparatus in the first embodiment.

6. Application to Electronic Device

The technology of the present disclosure is not limited to the application to the solid state imaging apparatus. In other words, the technology of the present disclosure can be applied to general electronic devices using the solid state imaging apparatus for an image capturing component (a photoelectric conversion component) including an imaging device such as a digital still camera and a video camera, a mobile terminal device having an imaging function, and a copy using a solid state imaging apparatus in an image reading component. The solid state imaging apparatus may be a one chip form or a module form having an imaging function where an imaging component and a signal processing component or an optical system are packaged in one piece.

Figure 30:
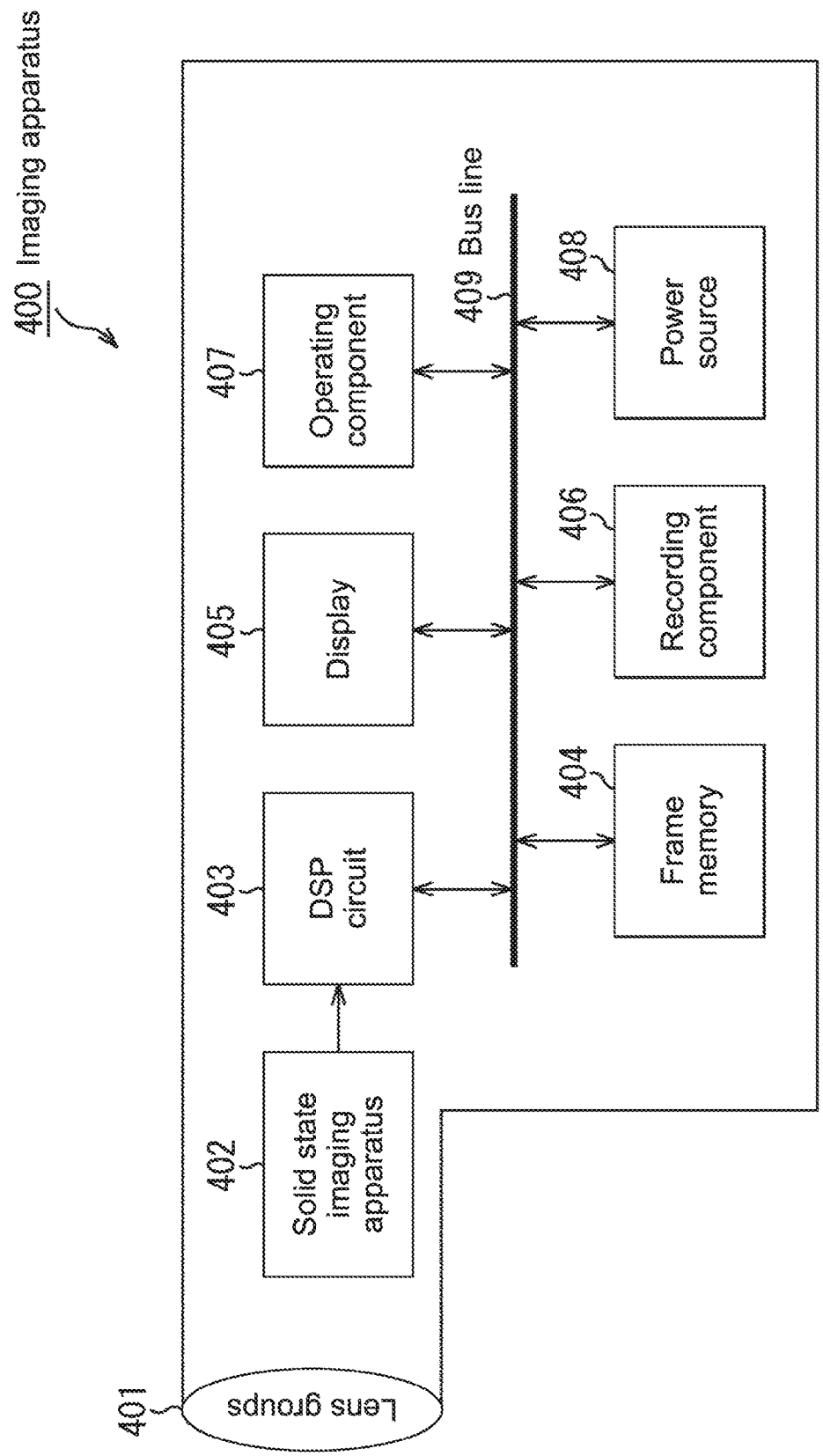
FIG. 30 is a block diagram showing a configuration embodiment of an imaging apparatus as an electronic device according to an embodiment of the present disclosure.

FIG. 30 is a block diagram showing a configuration embodiment of an imaging apparatus as an electronic device according to an embodiment of the present disclosure.

An imaging apparatus 400 shown in FIG. 30 includes an optical component 401 including lens groups, a solid state imaging apparatus (imaging device) 402 composed of the solid state imaging apparatus 1 shown in FIG. 1, and a DSP (Digital Signal Processor) circuit 403 that is a camera signal processing circuit. In addition, the imaging apparatus 400 includes a frame memory 404, a display 405, a recording component 406, an operating component 407 and a power source 408. The DSP circuit 403, the frame memory 404, the display 405, the recording component 406, the operating component 407 and the power source 408 are mutually connected via a bus line 409.

The optical component 401 receives an incident light (an imaging light) from an object to be imaged and forms an image on an imaging area of the solid state imaging apparatus 402. The solid state imaging apparatus 402 converts an incident light amount when the image is formed on the imaging area by the optical component 401 into an electrical signal per pixel unit, and outputs it as a pixel signal. As the solid state imaging apparatus 402, the solid state imaging apparatus 1 shown in FIG. 1, i.e., the solid state imaging apparatus for reducing a flare component, can be used.

The display 405 is composed of a panel display such as a liquid crystal display and an organic EL (Electro Luminescence) panel, and displays a moving image or a still image captured by the solid state imaging apparatus 402. The recoding component 406 records the moving image or the still image captured by the solid state imaging apparatus 402 on a recording medium such as a hard disk and a semiconductor memory.

The operating component 407 issues an operating command about a variety of functions belonging to the imaging apparatus 400 by a user's operation. The power source 408 supplies a power to a target to be supplied including the DSP circuit 403, the frame memory 404, the display 405, the recording component 406 and the operating component 407, as appropriate.

As described above, the solid state imaging apparatus 1 according to the embodiments of the present disclosure is used as the solid state imaging apparatus 402, thereby reducing a flare component. Accordingly, a captured image having a high image quality can be provided in the imaging apparatus 400 such as a video camera, a digital still camera and a camera module for a mobile device such as a mobile phone.

The present disclosure is not limited to be applied to a solid state imaging apparatus for detecting a distribution of an incident visible light amount and capturing an image, and can also be applied to general solid state imaging apparatuses (physical amount distribution detection apparatuses) in a broad sense including a fingerprint detection sensor by detecting a distribution of other physical amount such as a pressure and a capacitance and capturing an image.

The present embodiments according to the present disclosure are not limited to the above-described embodiments, and variations and modifications may be made without departing from the scope of the present disclosure.

The present disclosure may have the following configurations.

(1) A solid state imaging apparatus, including:
an insulation structure formed of an insulation substance penetrating through at least a silicon layer at a light receiving surface side, the insulation structure having a forward tapered shape where a top diameter at an upper portion of the light receiving surface side of the silicon layer is greater than a bottom diameter at a bottom portion of the silicon layer.

(2) The solid state imaging apparatus according to (1), in which the insulation structure is a pad surrounding guard ring disposed around an electrode pad portion.

(3) The solid state imaging apparatus according to (1) or (2), in which the insulation structure is a chip surrounding guard ring disposed at a side of a scribe area.

(4) The solid state imaging apparatus according to any one of (1) to (3), in which the insulation structure is formed by at least one of a material used for an antireflection film, a Si compound, a copolymerization based resin material used for an on-chip lens and an air gap.

(5) The solid state imaging apparatus according to any one of (1) to (4), which is a laminated type solid state imaging apparatus formed by bonding a first semiconductor substrate on which at least a photo diode is formed to a second semiconductor substrate on which at least a logic circuit is formed.

(6) The solid state imaging apparatus according to (5), in which the insulation structure is penetrated through the first semiconductor substrate at a light receiving surface side and is trenched to connect a wiring layer of the second semiconductor substrate.

(7) The solid state imaging apparatus according to (5), in which the insulation structure is penetrated through the first semiconductor substrate at a light receiving surface side and is trenched to connect a silicon layer of the second semiconductor substrate.

(8) The solid state imaging apparatus according to (5), including the two insulation structures, and in which a connection conductor filled between the two insulation structures has a share contact structure that is connected to both of a wiring layer of the first semiconductor substrate and a wiring layer of the second semiconductor substrate.

(9) The solid state imaging apparatus according to any one of (1) to (8), which is a back illumination type solid state imaging apparatus where a support substrate is bonded to the semiconductor substrate on which the silicon layer is formed.

(10) The solid state imaging apparatus according to (9), in which the insulation structure is trenched such that the insulation structure is connected to a lowermost layer of a plurality of wiring layers under the silicon layer of the semiconductor substrate.

(11) The solid state imaging apparatus according to any one of (1) to (10), in which the wiring layer connected to the insulation structure is isolated.

(12) A method of producing a solid state imaging apparatus, including:
bonding a first substrate to a second substrate including a silicon layer on which a photo diode is formed; and
trenching the second substrate from a light receiving surface side at least to a depth of the silicon layer in a longitudinal direction to form an opening where an insulation substance is filled.

(13) An electronic device, including:
a solid state imaging apparatus having an insulation structure formed of an insulation substance penetrating through at least a silicon layer at a light receiving surface side, the insulation structure having a forward tapered shape where a top diameter at an upper portion of a light receiving surface side of the silicon layer is greater than a bottom diameter at a bottom portion of the silicon layer.

(1) A solid state imaging apparatus, including:
an insulation structure formed by trenching a semiconductor substrate in a depth direction into which an insulation material is buried, the insulation structure having a maximum diameter positioned deeper than and is smaller than an uppermost surface of the semiconductor substrate.

(2) The solid state imaging apparatus according to (1) above, wherein
the insulation material is a coating material spin-coated by a spin coating method.

(3) The solid state imaging apparatus according to (1) or (2) above, wherein
an upper portion of the insulation structure has a bowing profile.

(4) The solid state imaging apparatus according to (1) or (2) above, wherein
the upper portion of the insulation structure has a peaked shape internally protruded on the uppermost surface of the semiconductor substrate.

(5) The solid state imaging apparatus according to any one of (1) to (3) above, wherein
the insulation material is buried into the insulation structure concurrently with a formation of a planarized film formed on the upper surface of the semiconductor substrate.

(6) The solid state imaging apparatus according to any one of (1) to (3) above, wherein
the insulation structure is a guard ring.

(7) The solid state imaging apparatus according to any one of (1) to (3) above, wherein
the insulation structure is a trench between pixels for separating photo diodes formed per pixel unit on the semiconductor substrate.

(8) A method of producing a solid state imaging apparatus, including:
trenching a semiconductor substrate in a depth direction to form an insulation structure having a maximum diameter positioned deeper than and is smaller than an uppermost surface of the semiconductor substrate, and
burying an insulation material into the insulation structure by a spin coating method.

(9) An electronic device, including:
a solid state imaging apparatus including an insulation structure formed by trenching a semiconductor substrate in a depth direction into which an insulation material is buried, the insulation structure having a maximum diameter positioned deeper than and is smaller than an uppermost surface of the semiconductor substrate.

It should be understood by those skilled in the art that various modifications, combinations, sub-combinations and alterations may occur depending on design requirements and other factors insofar as they are within the scope of the appended claims or the equivalents thereof.

What is claimed is:
1. An imaging device, comprising:
a first substrate including a plurality of photoelectronic conversion elements disposed in a pixel region of the imaging device and a first wiring layer;
a second substrate including a second wiring layer and at least a part of a logic circuit;
an insulation region penetrating through at least a silicon layer of the first substrate; and
a conductor disposed in a peripheral region of the imaging device other than the pixel region, wherein the conductor is connected to a connection portion in the second wiring layer,
wherein the first substrate is bonded to the second substrate,
wherein the insulation region includes at least a first insulation material and a second insulation material, and
wherein the insulation region is disposed around the connection portion in the second wiring layer in a plan view.

2. The imaging device according to claim 1, wherein the first insulation material is selected from the group consisting of silicon nitride, hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide yttrium oxide.

3. The imaging device according to claim 1, wherein the second insulation material is selected from silicon oxide, silicon nitride, silicon oxynitride and silicon carbide.

4. The imaging device according to claim 1, wherein the first insulation material is hafnium oxide and the second insulation material is silicon oxide.

5. The imaging device according to claim 4, wherein the insulation region further includes a resin material.

6. The imaging device according to claim 1, wherein the insulation region includes an air gap.

7. The imaging device according to claim 1, wherein the connection portion in the second wiring layer is coupled to a power source.

8. An electronic apparatus, comprising:
an optical component;
a signal processing circuit;

an imaging device, including:
- a first substrate including a plurality of photoelectronic conversion elements disposed in a pixel region of the imaging device and a first wiring layer;
- a second substrate including a second wiring layer and at least a part of a logic circuit;
- an insulation region penetrating through at least a silicon layer of the first substrate; and
- a conductor disposed in a peripheral region of the imaging device other than the pixel region, wherein the conductor is connected to a connection portion in the second wiring layer, wherein the first substrate is bonded to the second substrate, wherein the insulation region includes at least a first insulation material and a second insulation material, wherein the insulation region is disposed around the connection portion in the second wiring layer in a plan view, wherein the optical component focuses incident light onto the imaging device, and wherein the signal processing circuit receives and processes an output signal from the imaging device.

9. The electronic apparatus according to claim 8, wherein the first insulation material is selected from the group consisting of silicon nitride, hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide yttrium oxide.

10. The electronic apparatus according to claim 8, wherein
the second insulation material is selected from silicon oxide, silicon nitride, silicon oxynitride and silicon carbide.

11. The electronic apparatus according to claim 8, wherein the first insulation material is hafnium oxide and the second insulation material is silicon oxide.

12. The electronic apparatus according to claim 11, wherein the insulation region further includes a resin material.

13. The electronic apparatus according to claim 8, wherein the insulation region includes an air gap.

14. The electronic apparatus according to claim 8, wherein the connection portion in the second wiring layer is coupled to a power source.

* * * * *